US 8,274,838 B2

(12) United States Patent
Dutta et al.

(10) Patent No.: US 8,274,838 B2
(45) Date of Patent: Sep. 25, 2012

(54) PROGRAMMING NON-VOLATILE MEMORY WITH BIT LINE VOLTAGE STEP UP

(75) Inventors: Deepanshu Dutta, Santa Clara, CA (US); Jeffrey W. Lutze, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 247 days.

(21) Appl. No.: 12/838,902

(22) Filed: Jul. 19, 2010

(65) Prior Publication Data

US 2012/0014184 A1    Jan. 19, 2012

(51) Int. Cl.
*G11C 16/04* (2006.01)
(52) U.S. Cl. ......... 365/185.28; 365/185.03; 365/185.19; 365/185.24
(58) Field of Classification Search ............... 365/185.28
See application file for complete search history.

(56) References Cited

U.S. PATENT DOCUMENTS

| | | | |
|---|---|---|---|
| 6,327,183 B1 | 12/2001 | Pawletko et al. | |
| 6,643,188 B2 * | 11/2003 | Tanaka et al. ............. | 365/189.16 |
| 7,177,199 B2 * | 2/2007 | Chen et al. ............... | 365/185.28 |
| 7,551,477 B2 | 6/2009 | Mokhlesi et al. | |
| 7,564,713 B2 | 7/2009 | Moroka | |
| 7,633,807 B2 * | 12/2009 | Chen et al. ............... | 365/185.24 |
| 7,688,638 B2 * | 3/2010 | Hemink .................... | 365/185.22 |
| 7,944,756 B2 * | 5/2011 | Ueno ........................ | 365/185.22 |
| 7,986,573 B2 * | 7/2011 | Li ............................... | 365/190 |
| 8,089,815 B2 * | 1/2012 | Li et al. ..................... | 365/185.26 |
| 2006/0221697 A1 | 10/2006 | Li et al. | |
| 2007/0155226 A1 | 7/2007 | Chen | |
| 2008/0273385 A1 | 11/2008 | Goda et al. | |
| 2008/0298124 A1 | 12/2008 | Wong | |
| 2009/0010068 A1 * | 1/2009 | Lee .......................... | 365/185.19 |
| 2010/0034019 A1 | 2/2010 | Kang et al. | |
| 2010/0080064 A1 | 4/2010 | Di Iorio et al. | |
| 2010/0091576 A1 | 4/2010 | Kwon et al. | |

OTHER PUBLICATIONS

International Search Report & The Written Opinion of the International Searching Authority dated Oct. 18, 2011, International Application No. PCT/US2011/044016.

* cited by examiner

*Primary Examiner* — Son Mai
(74) *Attorney, Agent, or Firm* — Vierra Magen Marcus & DeNiro LLP

(57) ABSTRACT

Threshold voltage distributions in a non-volatile memory device are narrowed, and/or programming time is reduced, using a programming technique in which the bit line voltage for storage elements having a target data state is stepped up, in lock step with a step up in the program voltage. The step up in the bit line voltage is performed at different times in the programming pass, for different subsets of storage elements, according to their target data state. The start and stop of the step up in the bit line voltage can be set based on a fixed program pulse number, or adaptive based on a programming progress. Variations include using a fixed bit line step, a varying bit line step, a data state-dependent bit line step, an option to not step up the bit line for one or more data states and an option to add an additional bit line bias.

26 Claims, 13 Drawing Sheets

First programming pass

Second programming pass

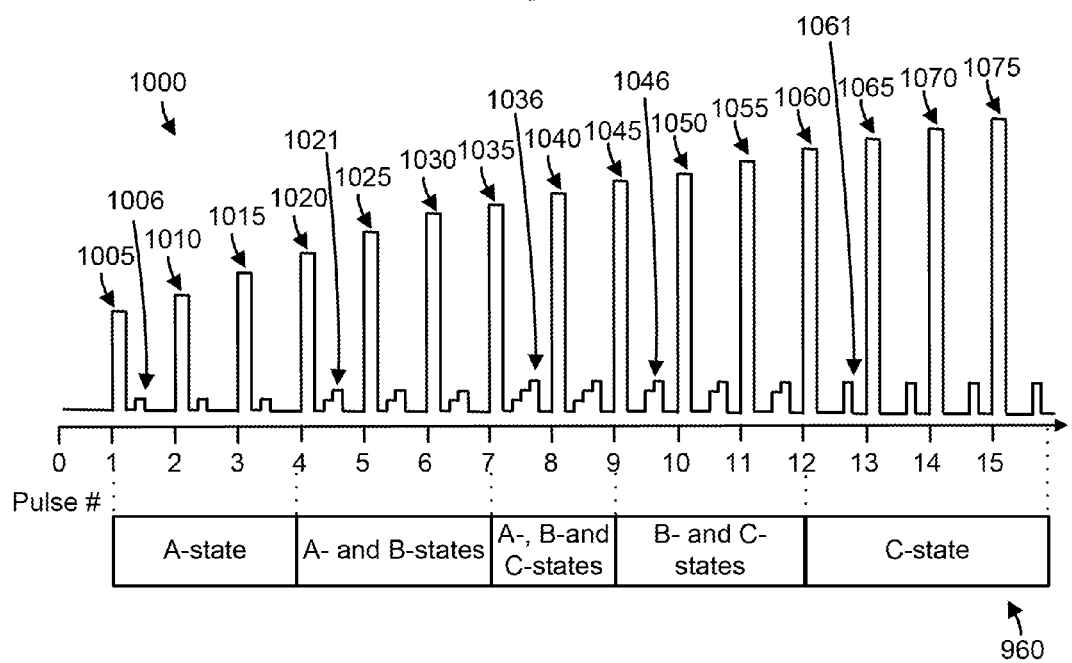
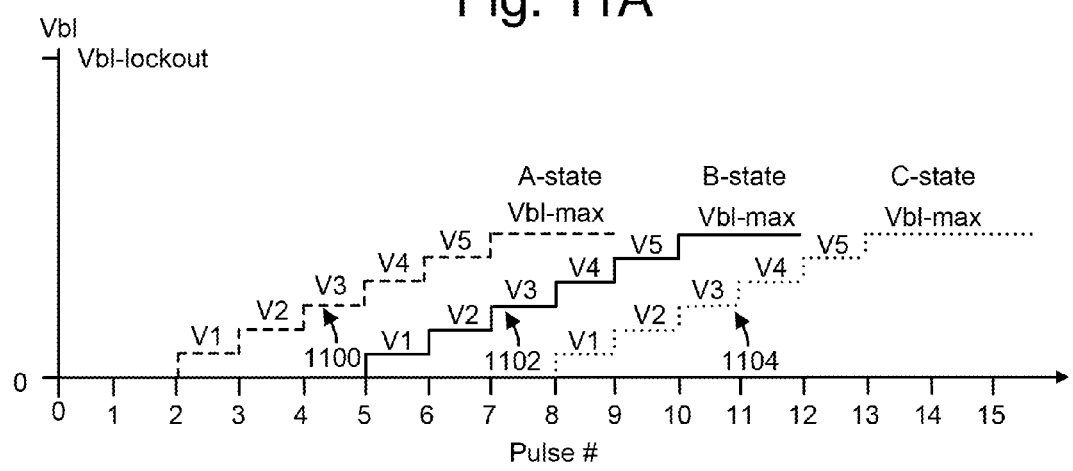

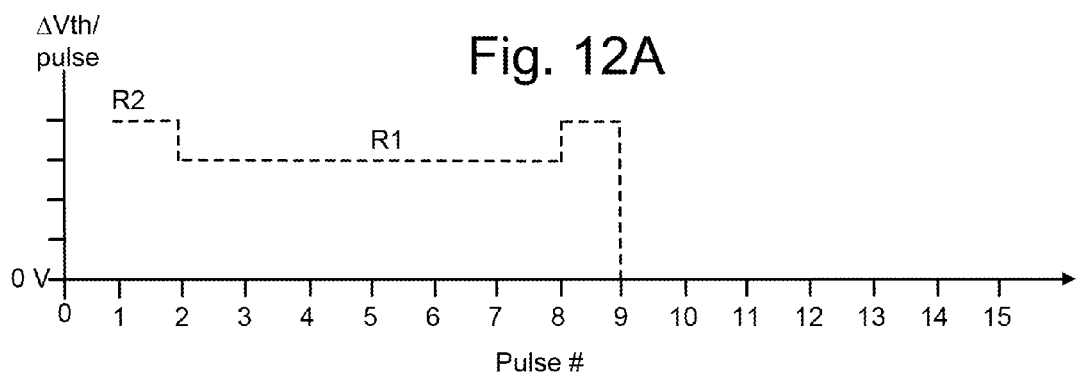
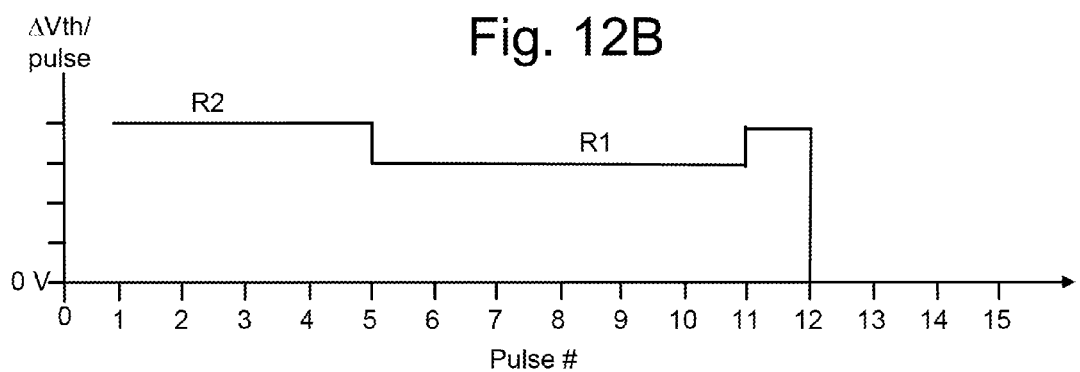
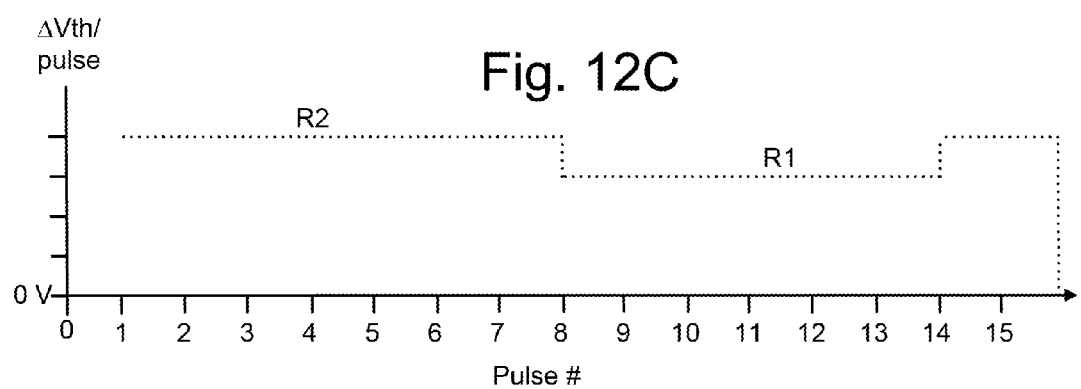

US 8,274,838 B2

PROGRAMMING NON-VOLATILE MEMORY WITH BIT LINE VOLTAGE STEP UP

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Techniques are need for accurately programming the threshold voltage ranges, in particular, as memory devices are scaled down, while reducing programming time.

BRIEF DESCRIPTION OF THE DRAWINGS

FIG. 6D depicts the second programming pass of a two-pass programming operation, referred to as a "two-pass write" programming technique, in which FIG. 6A depicts the first programming pass, and in which where up to two programming speeds may be used in a QPW programming option.

FIG. 10 depicts program-verify operations as a function of program pulse number for the sequence 960 of FIG. 9B.

FIG. 11A depicts stepping up of a bit line voltage as a function of program pulse number for different data states, where a common step size is used for all data states.

FIG. 12A depicts a programming rate as a function of program pulse number for A-state storage elements, consistent with FIG. 11A.

FIG. 12B depicts a programming rate as a function of program pulse number for B-state storage elements, consistent with FIG. 11A.

FIG. 12C depicts a programming rate as a function of program pulse number for C-state storage elements, consistent with FIG. 11A.

DETAILED DESCRIPTION

Figure 1:
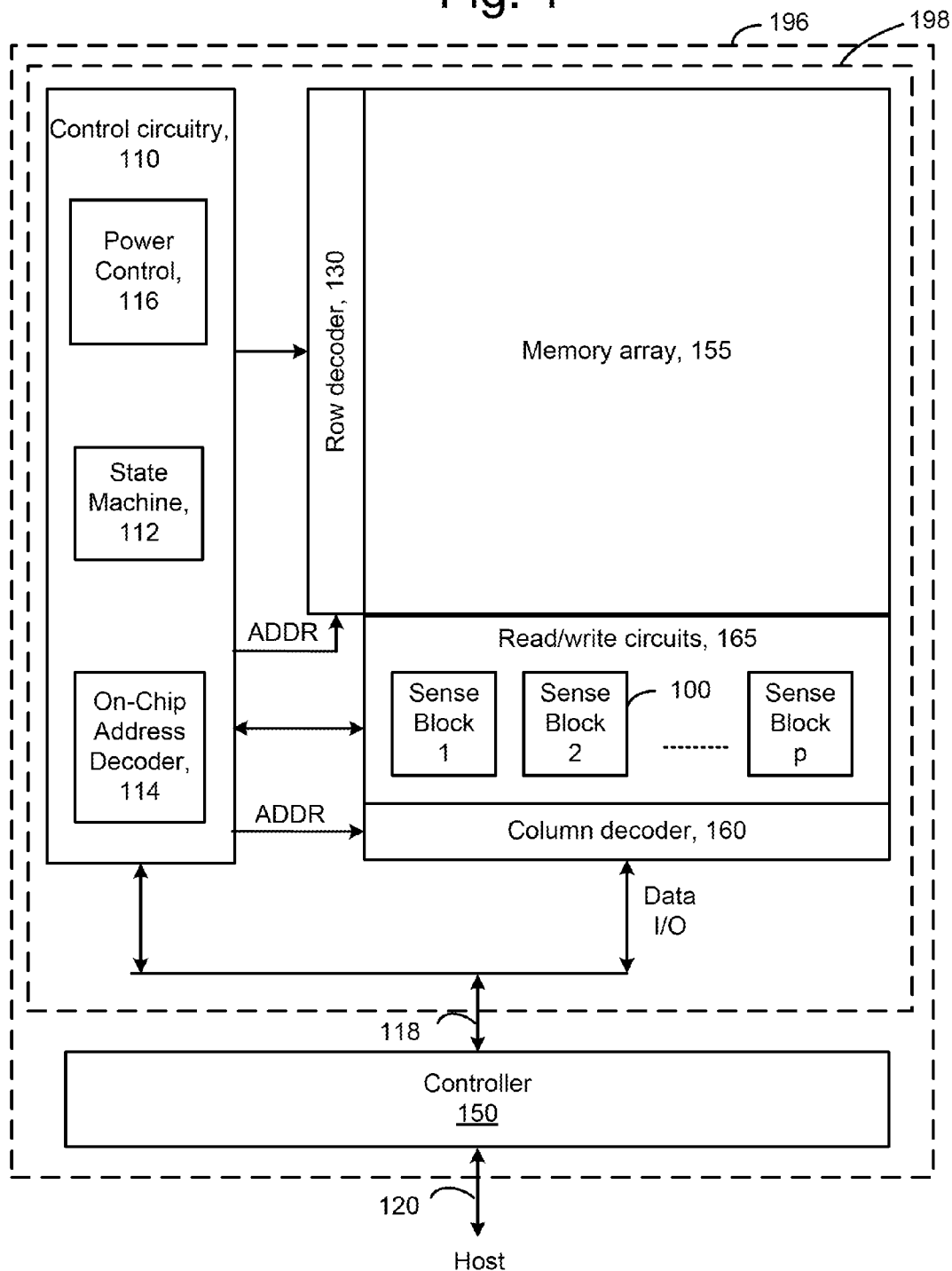
FIG. 1 is a block diagram of a non-volatile memory system using single row/column decoders and read/write circuits.

A method and non-volatile storage system are provided which accurately program threshold voltage ranges while reducing programming time.

During programming operations, there is a tradeoff between reducing programming time and achieving narrow threshold voltage ranges for the different data states. Programming speed can be increased by using a larger program pulse step size. However, this results in large overshoots past the verify level, causing a wide threshold voltage (Vth) range. On the other hand, if a smaller program pulse step size is used, a narrow Vth range is achieved at the cost of increased programming time. Another approach is to verify the storage elements at two separate verify levels for each state, in a dual verify scheme. When the Vth of a storage element exceeds a lower verify level, its programming speed is slowed by applying a bit line bias. Without a bit line bias, the Vth of a storage element increases with each program pulse by an amount which is roughly equal to a step size of the program pulse. With a bit line bias, the Vth of a storage element increases with each program pulse by an amount which is less than the step size of the program pulse. Thus, a storage element can be programmed at a reduced speed when its Vth exceeds a lower verify level of a target data state, and locked out from further programming when the Vth exceeds a higher verify level of the target data state.

In the dual verify scheme, the distance between the lower and higher verify levels for each state is optimized on silicon and set to the point at which the Vth distributions are narrowest. If the gap between the lower and higher verify levels, is too high, the Vth increases of the storage element will transition back to a steady state value (e.g., the same as the program pulse step size) and hence the benefit of the dual verify scheme is not realized. On the other hand, if the gap between the lower and higher verify levels is too small, the Vth of many storage elements can jump over the gap in one program pulse and hence their programming speed is not slowed down. In general, the optimum gap is a function of the program pulse step size. A larger program pulse step size tends to increase the optimum gap because the Vth takes larger jumps with each program pulse and hence a larger gap is required to ensure that the Vth does not jump right over the gap and past the higher verify level with only one program pulse.

Also, with the dual verify scheme, as memory devices are scaled down, program noise becomes worse. At a certain program pulse, even though the Vth of a majority of the storage elements jump by an amount which is roughly equal to the program pulse step size, we have many storage elements whose Vth jump is much higher. As a result, the optimum gap differs for different storage elements and is difficult to optimize.

To overcome these problems, a programming technique is provided which ensures that a majority of the storage elements are slowed in their programming, so that Vth distribution widths are narrow. In this approach, the bit line voltage (Vbl) for storage elements which have a particular target data state is stepped up with sequential program pulses, for a range of multiple successive program pulses. A different range of program pulses can be used for each target data state, although the ranges can overlap. The bit line voltage step up can be done in the time period when a majority of the storage elements are close to completing programming to their target data state. During this period, the rate of increase of the Vth of these storage elements is effectively lowered, leading to a narrower Vth distribution. Also, since the bit line voltages for all the storage elements being programmed to a particular target data state are stepped up, all storage elements belonging to that target state, which have not yet been locked out are slowed down in programming.

Variations to the programming technique include using a fixed bit line step, a varying bit line step, a data state-dependent bit line step, an option to not step up the bit line for one or more data states and an option to add an additional bit line bias to the bit line step.

An example memory system which can be used with the programming technique is discussed next. FIG. 1 is a block diagram of a non-volatile memory system using single row/column decoders and read/write circuits. The diagram illustrates a memory device 196 having read/write circuits for reading and programming a page of storage elements in parallel, according to one embodiment. Memory device 196 may include one or more memory die 198. Memory die 198 includes a two-dimensional memory array of storage elements 155, control circuitry 110, and read/write circuits 165. The memory array 155 is discussed further in connection with FIG. 3.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 196 (e.g., a removable storage card) as the one or more memory die 198. Commands and data are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control 116, sense blocks 100 (including the processor 192 in FIG. 2), read/write circuits 165, and controller 150, etc. The sense block 100 is discussed further in connection with FIG. 2.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
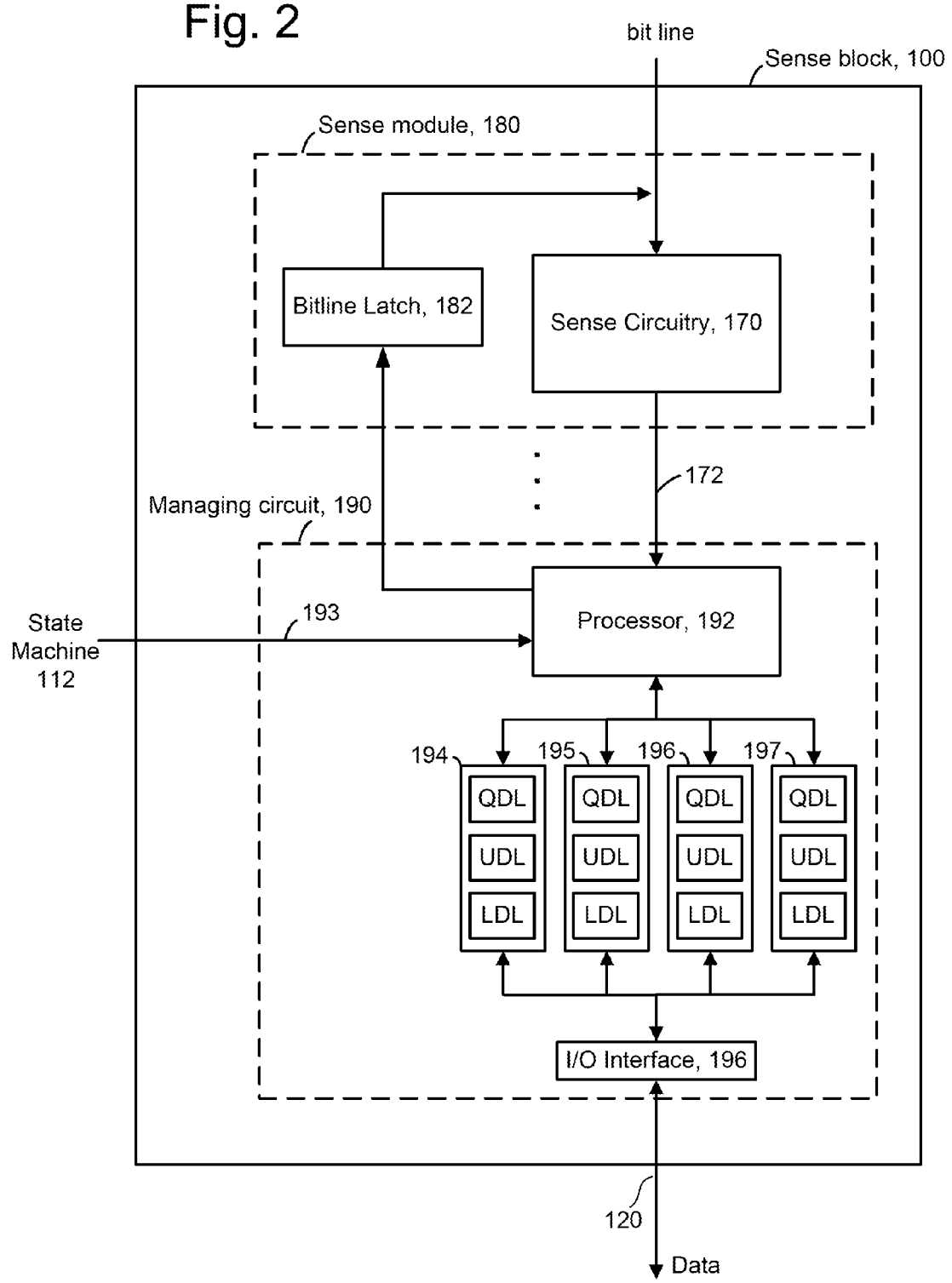
FIG. 2 is a block diagram depicting one embodiment of the sense block 100 of FIG. 1.

FIG. 2 is a block diagram depicting one embodiment of a sense block. An individual sense block 100 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provided for each sense module, and three data latches identified by QDL, UDL and LDL may be provided for each set. Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of M storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is: (a) below a lower verify level (e.g., VvaL, VvbL or VvcL in FIG. 4), in a fast programming mode, (b) above a lower verify level but below a higher, target verify level (e.g., Vva, Vvb or Vvc in FIG. 4), in a slow programming mode, or (c) above the higher, target verify level, in an inhibit or locked out mode. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. The UDL latches can be used to store an upper page of data, for instance. A UDL latch is flipped when an upper page bit is stored in an associated storage element. This occurs when an associated storage element completes programming, e.g., when its Vth exceeds a target verify level such as Vva, Vvb or Vvc. The QDL latches can be flipped when an associated storage element is in a slow programming mode.

Figure 3:
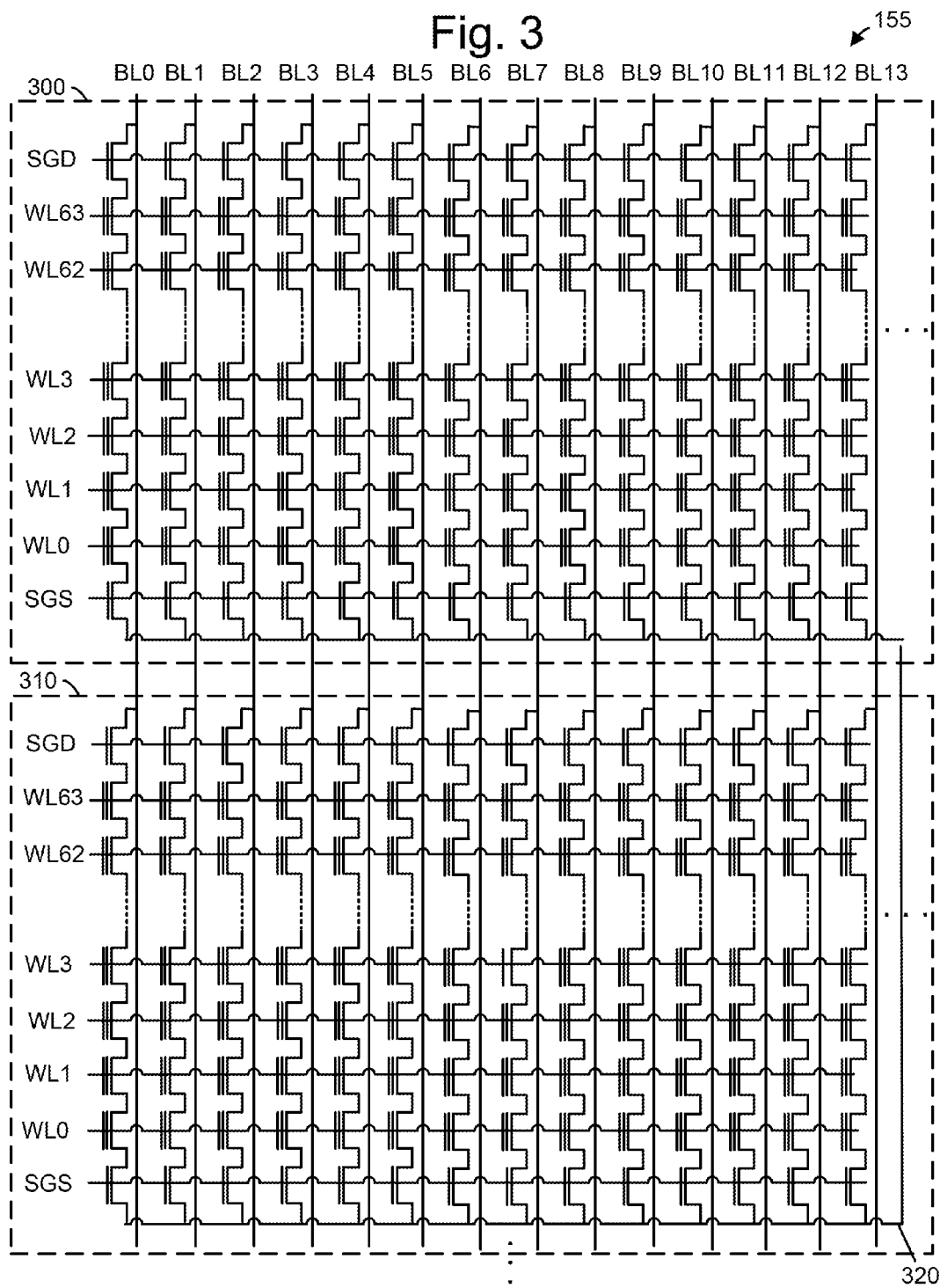
FIG. 3 depicts blocks of NAND flash memory cells in the memory array 155 of FIG. 1.

FIG. 3 depicts blocks of NAND flash memory cells in the memory array 155 of FIG. 1. The memory array can include many blocks. Each example block 300, 310 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 320. Sixty-four word lines, for example, WL0-WL63, extend between the source select gates and the drain select gates.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 4A:
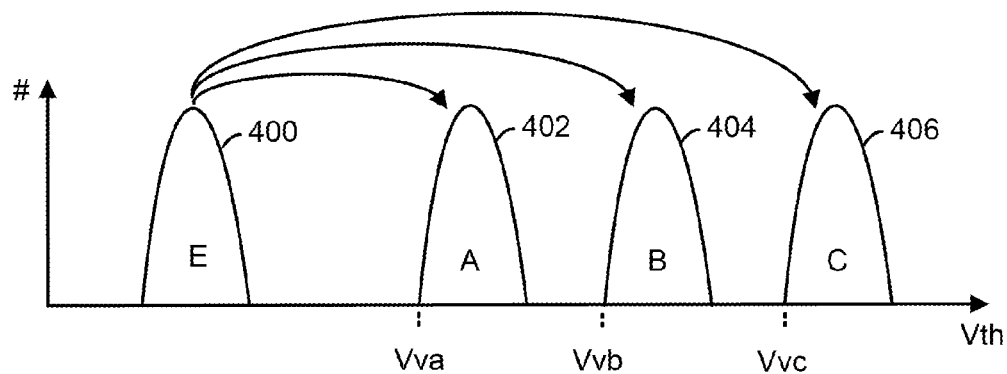
FIG. 4A depicts an example threshold voltage distribution and one-pass programming, referred to as a "one-pass write" programming technique.

FIG. 4A depicts an example Vth distribution and one-pass programming, referred to as a "one-pass write" programming technique. A programming pass is generally meant to encompass a sequence of multiple program-verify operations which are performed starting from an initial Vpgm level and proceeding to a final Vpgm level until one or more respective verify levels are reached for a set of storage elements. Example Vth distributions for the storage element array are provided for a case where each storage element stores two bits of data. A first Vth distribution 400 is provided for erased (E-state) storage elements. Three Vth distributions 402, 404 and 406 represent programmed states A, B and C, respectively. In one embodiment, the threshold voltages in the E-state distribution are negative and the threshold voltages in the A-, B- and C-state distributions are positive.

The number of storage elements which are in a particular state can be determined by maintaining a count of storage elements whose Vth is determined to exceed the corresponding verify level.

Each distinct Vth range corresponds to predetermined values for the set of data bits. The specific relationship between the data programmed into the storage element and the Vth levels of the storage element depends upon the data encoding scheme adopted for the storage elements. In one embodiment, data values are assigned to the Vth ranges using a Gray code assignment so that if the Vth of a floating gate erroneously shifts to its neighboring physical state, only one bit will be affected. One example assigns "11" to Vth range E (state E), "10" to Vth range A (state A), "00" to Vth range B (state B) and "01" to Vth range C (state C). However, in other embodiments, Gray code is not used. Although four states are shown, the other multi-state structures including those that include more or less than four states can also be used.

Three read reference voltages, Vra, Vrb and Vrc, are also provided for reading data from storage elements. By testing whether the Vth of a given storage element is above or below Vra, Vrb and Vrc, the system can determine the state, e.g., programming condition, the storage element is in.

Further, three target verify reference voltages, Vva, Vvb and Vvc, are provided. When programming storage elements to state A, the system will test whether those storage elements have a Vth greater than or equal to Vva. When programming storage elements to state B, the system will test whether the storage elements have threshold voltages greater than or equal to Vvb. When programming storage elements to state C, the system will determine whether storage elements have their Vth greater than or equal to Vvc.

In one embodiment, known as full sequence programming, storage elements can be programmed from the E-state directly to any of the programmed states A, B or C. For example, a population of storage elements to be programmed may first be erased so that all storage elements in the population are in erased state E. A series of program pulses such as depicted in FIG. 10 will then be used to program storage elements directly into states A, B or C. While some storage elements are being programmed from state E to state A, other storage elements are being programmed from state E to state B and/or from state E to state C.

Figure 4B:
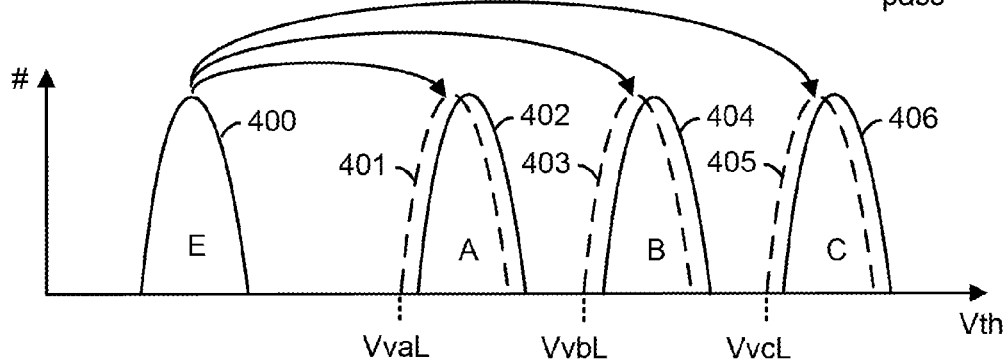
FIGS. 4B and 4C depict an example threshold voltage distribution and two-pass programming, referred to as a "two-pass write" programming technique.
Figure 4C:
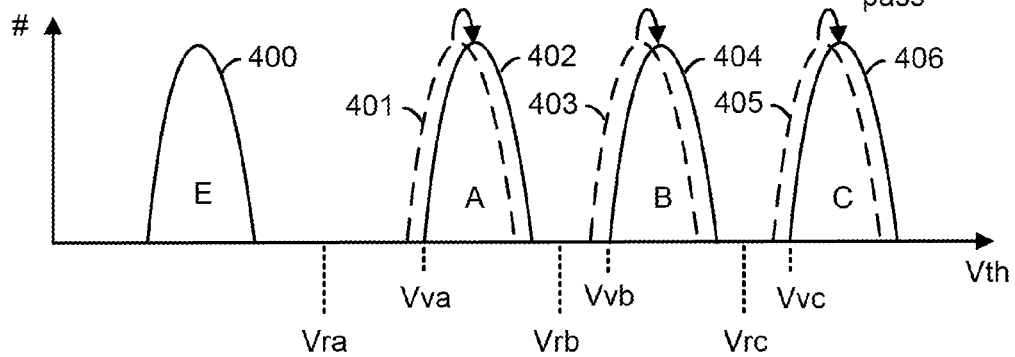

FIGS. 4B and 4C depict an example threshold voltage distribution and two-pass programming, referred to as a "two-pass write" programming technique. In this approach, lower and higher verify levels are used for one or more data states. For example, VvaL and Vva are lower and higher verify levels, respectively, for the A-state, VvbL and Vvb are lower and higher verify levels, respectively, for the B-state and VvcL and Vvc are lower and higher verify levels, respectively, for the C-state. A lower verify level is offset from the higher verify level. The verify level can represent a voltage or a current.

During programming, when the Vth of an A-state storage element (which is intended to be programmed to the A-state as a target state) is less than or equal to VvaL, the storage element is programmed in a fast programming mode. This may be achieved by grounding the bit line. When Vva≧Vth>VvaL, the storage element is programmed in a slow programming mode, such as by raising the associated bit line voltage to a level which is between ground and a full inhibit or lockout level. This provides greater accuracy and thus a narrower Vth distribution by avoiding large step increases in Vth. When Vth>Vva, the storage element is locked out from further programming. Similarly, a B-state storage element (which is intended to be programmed to the B-state) can have fast and slow programming modes. Note that, in one approach, a slow programming mode is not used for the highest state, such as the C-state, as it is less beneficial than with other states. VvcL, which allows a slow programming mode for the C state, is depicted.

In an example of eight-state programming, with an erased state and seven programmed states A-G, fast and slow programming modes could be used for the states A-F, for instance.

In the first programming pass (FIG. 4B), the A-, B- and C-state storage elements are programmed from the E-state 400 to the respective lower verify levels VvaL, VvbL or VvcL, respectively, of the A-, B- and C-states (lower distributions 401, 403 and 405, respectively). In the second programming pass (FIG. 4C), the A-, B- and C-state storage elements are programmed from the lower distributions 401, 403 and 405, respectively, to the final distributions 402, 404 and 406, respectively, using the verify levels Vva, Vvb and Vvc, respectively.

Figure 5A:
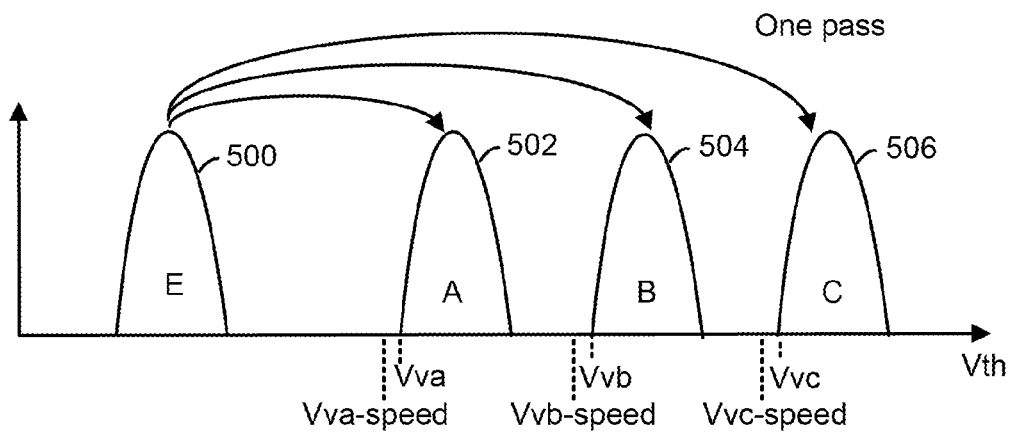
FIG. 5A depicts an example threshold voltage distribution and one-pass write programming, where up to two programming speeds may be used in a "quick pass write" (QPW) programming option.

FIG. 5A depicts an example threshold voltage distribution and one-pass write programming, where up to two programming speeds may be used in a QPW programming option. Generally, for each target state, a verify level can be defined which triggers a slower programming speed for a storage element when it is exceeded. This verify level can be different from a verify level which signals the end of a programming pass. In this example, a single programming pass is used to program A-state storage elements from the E-state distribution 500 to an A-state distribution 502, thereby passing a verify level Vva-speed, which acts as a checkpoint to trigger a slower programming speed for each A-state storage element for which Vva≧Vth>Vva-speed, such as by raising an associated bit line voltage. The A-state storage elements for which Vth≦Vva-speed are programmed with a faster speed, such as by keeping their bit line voltage grounded. All A-state storage elements whose Vth reaches Vva (forming distribution 502) are locked out from further programming.

Similarly, the single programming pass is used to program B-state storage elements from the E-state distribution 500 to a B-state distribution 504, thereby passing a verify level Vvb-speed, which acts as a checkpoint to trigger a slower programming speed for each B-state storage element for which Vvb≧Vth>Vvb-speed. The B-state storage elements for which Vth≦Vvb-speed are programmed with a faster speed. All B-state storage elements whose Vth reaches Vvb (forming distribution 504) are locked out from further programming.

Also, the single programming pass is used to program C-state storage elements from the E-state distribution 500 to a C-state distribution 506, thereby passing a verify level Vvc-speed, which acts as a checkpoint to trigger a slower programming speed for each C-state storage element for which Vvc≧Vth>Vvc-speed. The C-state storage elements for which Vth≦Vvc-speed are programmed with a faster speed. All C-state storage elements whose Vth reaches Vvc (forming distribution 506) are locked out from further programming.

Regarding the reference to up to two programming speeds in this programming option, in comparison, in the technique of FIGS. 4A-4C, we use two programming passes, in a "two-pass write" technique. This is done to reduce the impact of interference effects from neighbor storage elements. In the first pass, we program all the storage elements close to their final target Vth. Then, during the second pass, we program the storage elements to reach the final target Vth. So, the total Vth shift between the first and second passes is smaller and hence the corresponding interference effects on neighboring storage elements is also smaller. The programming can be done in the order shown in FIGS. 7A and 7B, for instance, discussed further below. During the second pass, since the storage elements are already programmed to close to their destination, when we program them, they initially program slower naturally since their Vth's are higher than their steady state values. This "pass write effect" helps to tighten the final Vth distribution.

A programming option which may use up to two programming speeds may be referred to as a "quick pass write" (QPW) technique. QPW can be used independently in the first or second pass, or both, of a two pass technique. For each pass in which we use QPW, a lower-verify level (Vva-speed, Vvb-speed, VVc-speed) is used which is below the verify level at which the programming pass ends and lockout occurs. This lower verify level acts as a checkpoint to slow down programming but does not trigger lockout of a storage element. In QPW, we artificially slow down the programming speed of a storage element by applying a bit line bias to an associated channel region of the storage element. Also, note that the QPW-verify levels (Vva-speed, Vvb-speed, VVc-speed) can be optimized independently. There is an optimum gap between Vva-speed and Vva at which we obtain the most benefit of QPW in tightening the Vth distribution. The QPW-verify levels do not depend on the verify levels of a previous programming pass. The optimum gap mentioned can be the same or different for each target state. Note also that in QPW there can be some storage elements that may be programmed with only one speed—not two speeds—such as an A-state storage element whose Vth jumps right above Vva-speed and reaches Vva with one programming pulse. Such a storage element reaches its target level without experiencing the slow programming. So, not all storage elements are programmed with two speeds in QPW. However, typically most storage elements are programmed with two speeds.

Figure 5B:
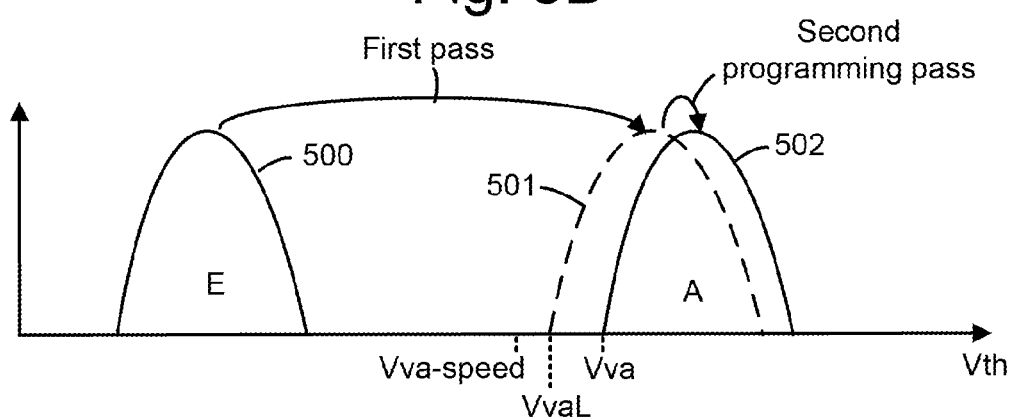
FIG. 5B depicts an example threshold voltage distribution for the A-state during two-pass programming, where up to two programming speeds may be used in a QPW programming option, in the first programming pass.

FIG. 5B depicts an example threshold voltage distribution for the A-state during two-pass programming, where up to two programming speeds may be used in a QPW programming option, during the first programming pass. While the A-state is examined alone for clarity, the other target data states can be handled similarly. In this case, the A-state storage elements pass Vva-speed in the first programming pass, so that their programming is fast for a first part of the first programming pass and slow for a second part of the first programming pass. Thus, in the first programming pass, the A-state storage elements transition from the E-state distribution 500 to a lower A-state distribution 501 defined by VvaL, thereby passing Vva-speed, which acts as a checkpoint to trigger a slower programming speed for each A-state storage element. The speed of the A-state storage elements is thus slowed as they transition to the lower A-state distribution 501, signaling the end of the first programming pass for each A-state storage element for which Vth>VvaL. In the second programming pass, the A-state storage elements are programmed from the distribution 501 to the distribution 502, defined by Vva, signaling the end of the second programming pass for each A-state storage element for which Vth>Vva. The second programming pass can optionally use QPW as well, as discussed next.

Figure 5C:
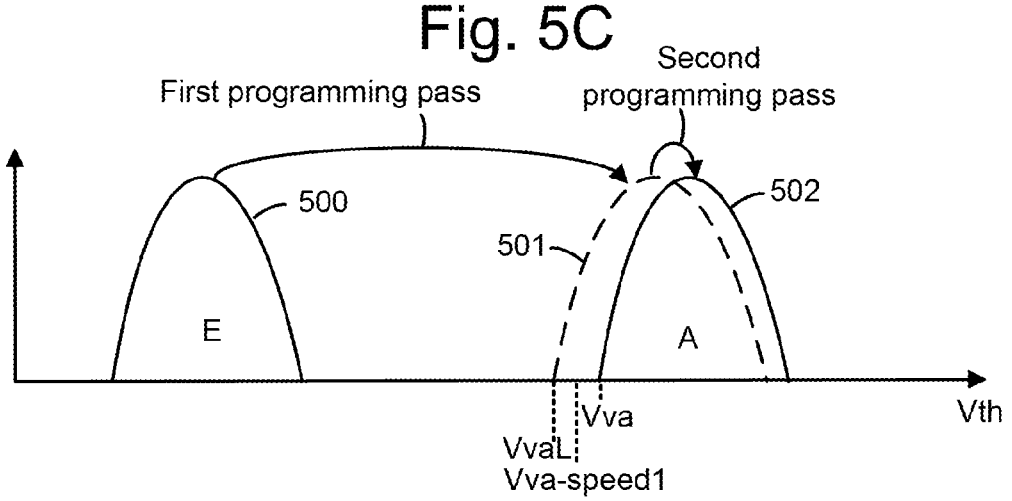
FIG. 5C depicts an example threshold voltage distribution for the A-state during two-pass programming, where up to two programming speeds may be used in a QPW programming option, in the second programming pass.

FIG. 5C depicts an example threshold voltage distribution for the A-state during two-pass programming, where up to two programming speeds may be used in a QPW programming option, during the second programming pass. Again, while the A-state is examined alone for clarity, the other target data states can be handled similarly. In this case, the A-state storage elements pass a verify level Vva-speed1 in the second programming pass, which may differ from Vva-speed in FIG. 5B. First, the A-state storage elements transition from the E-state distribution 500 to the lower A-state distribution 501, defined by VvaL, signaling the end of the first programming pass for each A-state storage element for which Vth>VvaL. The first programming pass can optionally use QPW as described in FIG. 5B. In the second programming pass, the A-state storage elements transition from the distribution 501 to the distribution 502 initially at a fast speed, when Vth≦Vva-speed1, and then at a slow speed, when Vth>Vva-speed1. The end of the second programming pass is signaled for each A-state storage element for which Vth>Vva.

Figure 6A:
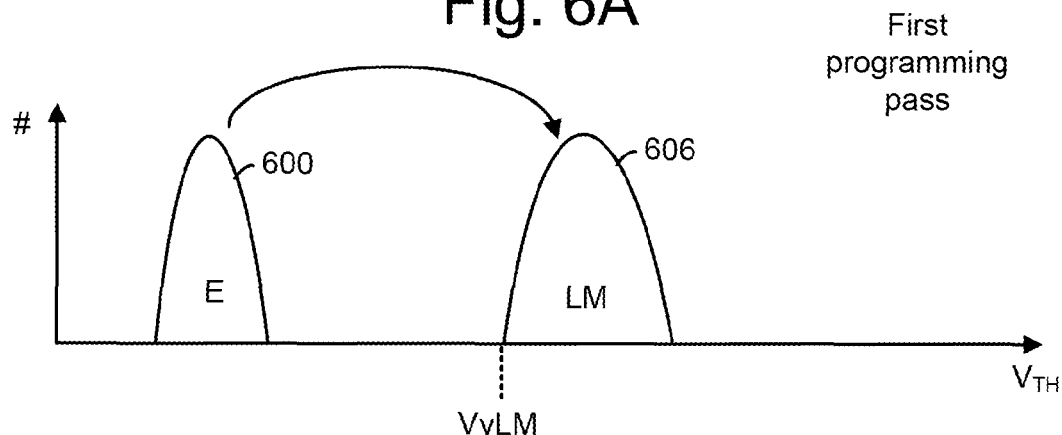
FIGS. 6A, 6B and 6C depicts the first, second and third programming passes, respectively, of a three pass programming operation, referred to as a "three-pass write" programming technique, in which an intermediate or lower-middle (LM) verify voltage is used.
Figure 6B:
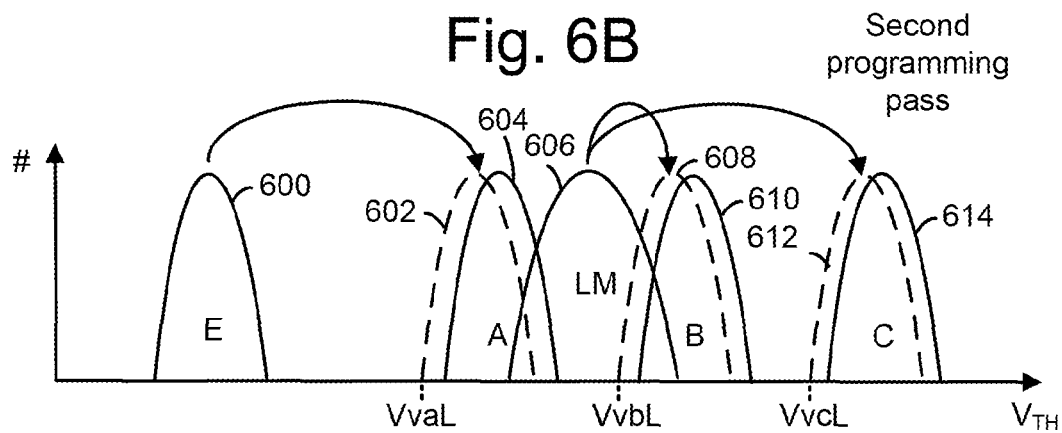
Figure 6C:
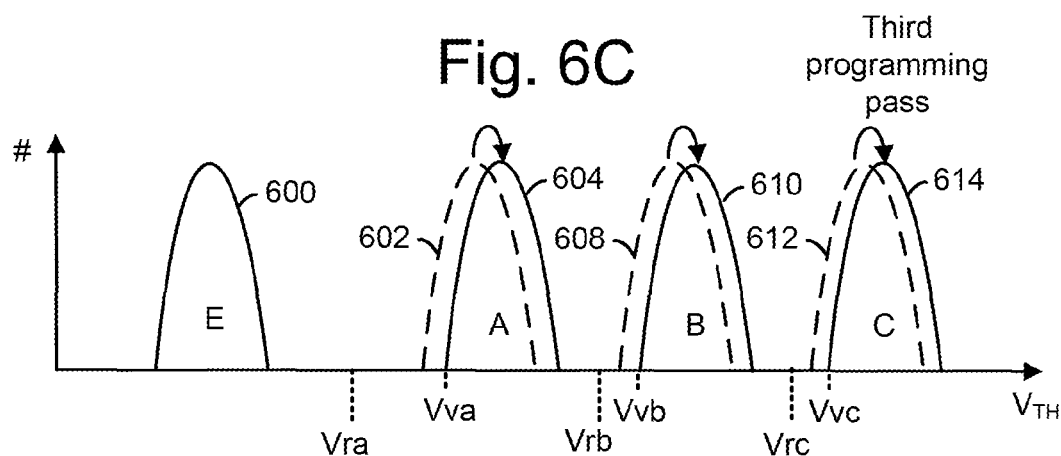

FIGS. 6A, 6B and 6C depicts the first, second and third programming passes, respectively, of a three-pass programming operation, referred to as a "three-pass write" programming technique, in which an intermediate or lower-middle (LM) state is used. This programming technique reduces the effect of floating gate-to-floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, the E-state is the erased state and states A, B and C are the programmed states. As before, the E-state stores data 11, state A stores data 01, state B stores data 00 and state C stores data 10. Other encodings of data-to-physical data states can also be used. Each storage element stores two pages of data. For reference purposes, these pages of data will be called upper page and lower page; however, they can be given other labels.

In the first programming pass, the lower page is programmed for a selected word line WLn. For example, this can correspond to step "1" in FIG. 7B (discussed below). If the lower page is to remain data 1, then the storage element state remains at state E (distribution 600). If the data is to be programmed to 0, then the threshold voltage of the storage elements on WLn are raised such that the storage element is programmed to an intermediate (LM or lower middle) state (distribution 606). FIG. 6A therefore shows the programming of storage elements from the E-state to the LM-state.

In one embodiment, after a storage element is programmed from the E-state to the LM-state, its neighbor storage element on an adjacent word line WLn+1 in the NAND string will then be programmed with respect to its lower page. This will have the effect of widening the Vth distribution 606 for state LM for the storage elements on WLn. This apparent widening of the Vth distribution will be remedied when programming the upper page. The E state distribution 600 will also be widened. After the first programming pass for WLn is performed, a similar first programming pass can be performed for WLn, as indicated by step "2" in FIG. 7B.

FIG. 6B depicts programming of the upper page using lower verify levels VvaL, VvaB and VvaC. For example, this can correspond to step "3" in FIG. 7B. Moreover, in one embodiment, before upper page programming, a read operation is performed to determine which storage elements belong to the E-state and which belong to the LM-state. This read operation can be done at the read level Vra or some other suitable voltage level between E-state and LM-state Vth distributions. This step is performed in an implementation in which the lower page data in the latches is removed after programming the lower page non WLn, so that the latch can be used for the lower page data for WLn+1. In this case, before programming the upper page on WLn, we do a read to determine the lower page data. In other implementations, this read step is not needed, such as where a binary cache is used which is able to save data for all pages for a word line throughout the different programming passes of the word line.

If the storage element is in the E-state and the upper page is 1, then the storage element will remain in the E-state (distribution 600). If the storage element is in the E-state and its upper page data is 0, then the Vth of the storage element will be raised above VvaL, (distribution 602). If the storage element was in the LM-state 606 and the upper page data is 0, then the Vth of the storage element will be programmed above VvbL (distribution 608). If the storage element is in the LM-state 606 and the upper page data is 1, then the Vth of the storage element will be raised above VvcL (distribution 612). The process depicted reduce the effect of floating gate-to-floating gate coupling because only the upper page programming of neighbor storage elements will have an effect on the apparent Vth of a given storage element. An example of an alternate state coding is to move from distribution 606 to state C when the upper page data is a 0, and to move to the B-state when the upper page data is a 1. After the second programming pass for WLn is performed, a first programming pass can be performed for WLn+2, as indicated by step "4" in FIG. 7B, and a second programming pass can be performed for WLn+1, as indicated by step "5" in FIG. 7B.

FIG. 6C depicts programming the upper page using higher verify levels Vva, Vvb and Vvc to provide a transition from distribution 602 to distribution 604 for the A-state, from distribution 608 to distribution 610 for the B-state, and from distribution 612 to distribution 614 for the C-state. For example, this can correspond to step "6" in FIG. 7B.

Although this three-pass programming example provides four data states and two pages of data, the concepts taught can be applied to other implementations with more or fewer than four states and more or less than two pages. For example, memory devices with eight or sixteen states per storage element are currently planned or in production.

Generally, the programming speed can be adjusted for any of the programming passes of FIGS. 6A-6C. For example, in the second programming pass of FIG. 6B, we can set Vva-speed<VvaL as depicted in FIG. 5B. Similarly, we can set Vvb-speed<VvbL and Vvc-speed<VvcL. In this case, in the second programming pass, the A-state storage elements are programmed at a fast speed when Vth≦Vva-speed, and at a slow speed when Vva-speed<Vth≦VvaL. Similarly, the B-state storage elements are programmed at a fast speed when Vth≦Vvb-speed, and at a slow speed when Vvb-speed<Vth≦VvbL. Similarly, the C-state storage elements are programmed at a fast speed when Vth≦Vvc-speed, and at a slow speed when Vvc-speed<Vth≦VvcL.

In an example for the third programming pass of FIG. 6C, we can set VvaL<Vva-speed<Vva as depicted in FIG. 5C. Similarly, we can set VvbL<Vvb-speed<Vvb and VvcL<Vvc-speed<Vvc. In this case, in the third programming pass, the A-state storage elements are programmed at a fast speed when VvaL<Vth≦Vva-speed, and at a slow speed when Vva-speed<Vth≦Vva. Similarly, the B-state storage elements are programmed at a fast speed when VvbL<Vth≦Vvb-speed, and at a slow speed when Vvb-speed<Vth≦Vvb. Similarly, the C-state storage elements are programmed at a fast speed when VvcL<Vth≦Vvc-speed, and at a slow speed when Vva-speed<Vth≦Vvc.

The preceding examples for the second and third programming passes can be used alone or in combination.

Figure 6D:
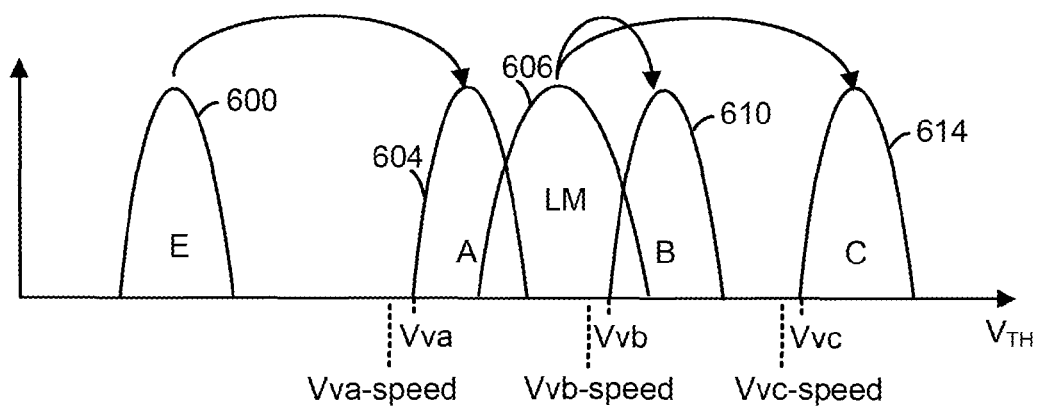

FIG. 6D depicts the second programming pass of a two-pass programming operation, referred to as a "two-pass write" programming technique, in which FIG. 6A depicts the first programming pass, and in which where up to two programming speeds may be used in a QPW programming option. In this further alternative, the verify levels Vva-speed, Vvb-speed and Vvc-speed, discussed in FIGS. 5A-C, are used to trigger a programming speed slow down. Specifically, A-state storage elements will be programmed at a fast speed when their Vth≦Vva-speed, and at a slow speed when their Vva>Vth>Vva-speed. Vth>Vva triggers the programming lockout condition. B-state storage elements will be programmed at a fast speed when their Vth≦Vvb-speed, and at a slow speed when their Vvb>Vth>Vvb-speed. Vth>Vvb triggers the programming lockout condition. C-state storage elements will be programmed at a fast speed when their Vth≦Vvc-speed, and at a slow speed when their Vvc>Vth>Vvc-speed. Vth>Vvc triggers the programming lockout condition.

Figure 7A:
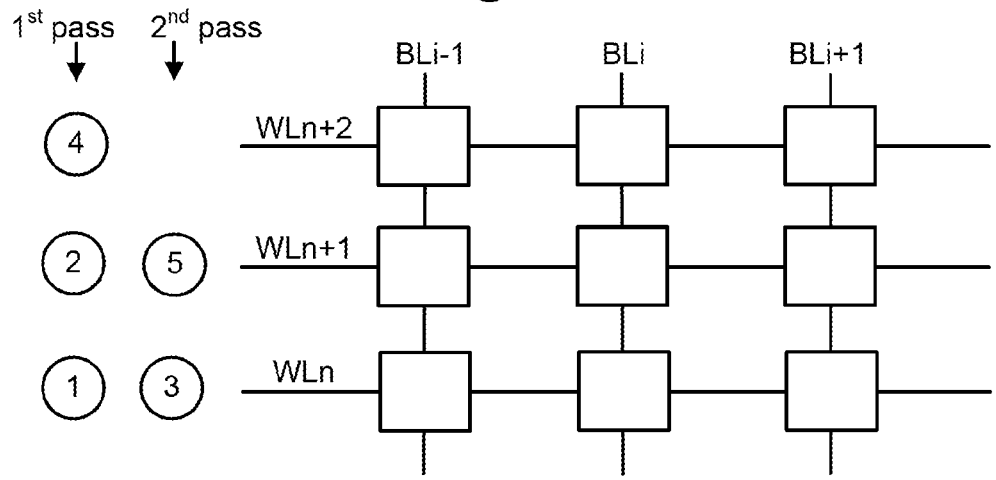
FIG. 7A depicts a two-pass programming operation for a set of storage elements in a back-and-forth word line order.

FIG. 7A depicts a two-pass programming operation for a set of storage elements in a back-and-forth word line order. The components depicted may be a subset of a much larger set of storage elements, word lines and bit lines. In one possible programming operation, storage elements (depicted as squares) on WLn are programmed in a first programming pass, as represented by the circled "1." Next ("2"), storage elements on WLn+1 are programmed in a first programming pass for that word line. In this example, when a word line is selected for programming, verify operations occur after each program pulse. During the verify operations on a selected word line, verify voltages are applied to the unselected word lines to turn on (make conductive) the unselected storage elements so that a sensing operation such as a verify operation can occur for the selected word line. Next ("3"), storage elements on WLn are programmed in a second programming pass. Next ("4"), storage elements on WLn+2 are programmed in a first programming pass for that word line. Next ("5"), the storage elements on WLn+1 are programmed in a second programming pass to their final respective states.

By programming the word lines in multiple programming passes, in a back and forth manner, capacitive coupling-caused interference effects, which tends to raise and widen their Vth distributions, are reduced. In contrast, in single-pass programming, each word line is programmed completely before moving to the next word line.

Figure 7B:
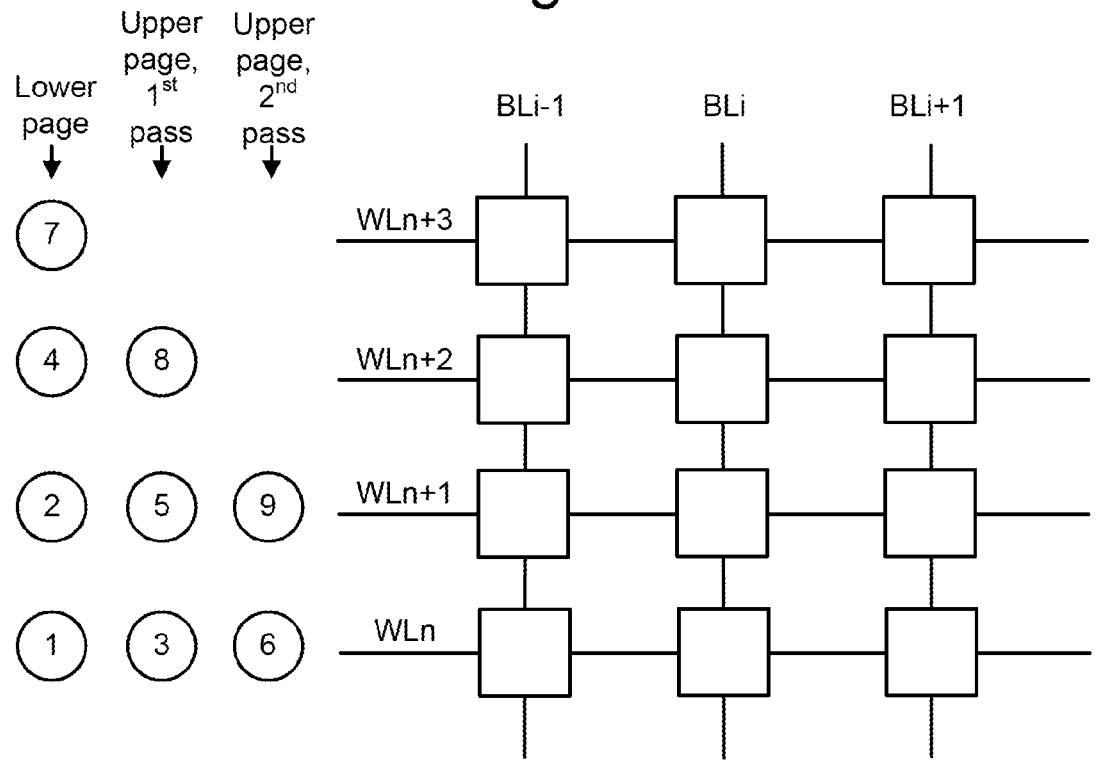
FIG. 7B depicts a three-pass programming operation for a set of storage elements in a back-and-forth word line order.

The first and second programming passes can use any of the programming schemes discussed herein. FIG. 7B depicts a three-pass programming operation for a set of storage elements in a back-and-forth word line order. An initial programming pass of a lower page is performed before first and second programming passes of an upper page. A first programming pass programs a lower page of data, a second programming pass programs an upper page of data in a first programming pass, and a third programming pass completes programming of the upper page of data in a second programming pass. At "1", a first programming pass is performed for WLn, at "2" a first programming pass is performed for WLn+1, at "3" a second programming pass is performed for WLn, at "4" a first programming pass is performed for WLn+2, at "5" a second programming pass is performed for WLn+1, at "6" a third programming pass is performed for WLn, at "7" a first programming pass is performed for WLn+3, at "8" a second programming pass is performed for WLn+2, at "9" a third programming pass is performed for WLn+1, and so forth.

In one possible approach, the first programming pass uses the verify level VvLM as depicted in FIG. 6A, the second programming pass uses the lower set of verify levels VvaL, VvbL and VvcL as depicted in FIG. 6B, and the third programming pass uses the higher set of verify levels Vva, Vvb and Vvc as depicted in FIG. 6C. The difference between the lower set of verify levels for the second programming pass and the higher set of verify levels for third programming pass can be optimized on silicon to achieve the tightest set of Vth distributions.

The first, second and third programming passes can use any of the programming schemes discussed herein.

Figure 8:
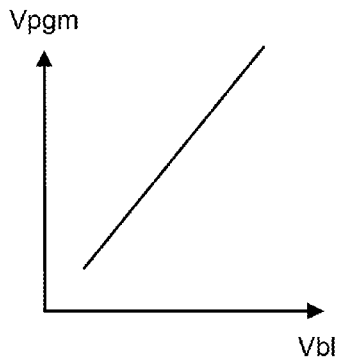
FIG. 8 depicts a relationship between a highest Vpgm needed to program a storage element and a bit line voltage of the storage element.

FIG. 8 depicts a relationship between the highest Vpgm needed to program a storage element and a bit line voltage of the storage element. The x-axis depicts increasing bit line voltage (Vbl) and the y-axis depicts the highest Vpgm voltage required to to complete programming of a storage element.

As Vbl increases, the highest Vpgm which is needed to complete programming of a storage element also increases. Generally, the degree to which the programming speed of a storage element is slowed is proportional to Vbl multiplied by a constant k, which is the slope of the line depicted. The constant is typically greater than one because an increase of 1 V in Vbl, e.g., a bit line step size of $\Delta Vbl=1$ V, requires an increase of more than 1 V by Vpgm, e.g., a program pulse step size of $\Delta Vpgm=1$ V, to offset. Increasing Vbl is therefore a powerful tool to control programming speed and narrow the width of Vth distributions. However, Vbl cannot be made too high, as it is mainly limited by the Vsgd (drain-side select gate) margin-window. When Vbl is higher, the Vsgd voltage needed to turn on the drain-side select gate for programming the storage elements is also higher. But, a higher Vsgd value has a risk of boost potential leakage from the channel of inhibited storage elements, which can lead to program disturb.

The programming speed of a storage element depends on the electric field across its tunnel oxide, which is proportional to the difference between the voltage of the floating gate and a voltage of the channel in the substrate, underneath the floating gate. Normally, the control gate voltage, Vpgm, is stepped up in a staircase manner, and Vbl is fixed at 0 V. To slow down programming (to tighten Vth distributions), we can use a smaller Vpgm step size. However, this leads to an increase in the number of program pulses and verify operations, thereby increasing overall programming time. Instead of changing the Vpgm step size, we can increase Vbl in a staircase manner, in lockstep with the steps of the Vpgm pulses, to reduce the effective Vpgm step size, $\Delta Vpgm$-effective. We can write: $\Delta Vpgm\text{-effective}=\Delta Vpgm-(k\times\Delta Vbl)$, where $k>1$ and $\Delta Vpgm\text{-effective}<\Delta Vpgm$. Typically the value of k can be around 1.4. A larger $\Delta Vbl$ results in a smaller $\Delta Vpgm$-effective. An advantage of this technique is that Vbl can be stepped up for different subsets of storage elements at different times, where each subset has a different target data state. Thus we can achieve different programming speed for set of storage elements belonging to different target data state. On the other hand, if Vpgm step size is reduced, then it affects the programming speed of all programming storage elements. In comparison with using an equivalent smaller Vpgm step size, by stepping up Vbl for a specific target data state at a time, we can keep the number of verify operations the same, while reducing the total number of program pulses required to finish programming, and hence improve performance by reducing overall programming time.

The lockstep increase in Vbl refers, e.g., to the fact that Vbl can be stepped up with each program pulse, for a given subset of storage elements which have a common target data state and which have not yet been locked out of programming. The Vbl of a storage element which is locked out of programming is set to Vbl-lockout.

Figure 9A:
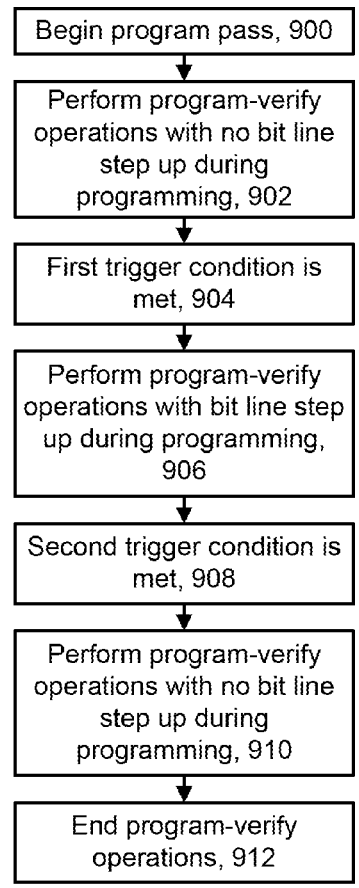
FIG. 9A depicts a programming technique in which a bit line voltage is stepped up.

FIG. 9A depicts a programming technique in which a bit line voltage is stepped up. A programming pass for storage elements of all target data states begins at step 900. Steps 902-912 are performed separately, and partly concurrently, for storage elements of all target data states. Step 902 includes performing one or more program-verify operations with no bit line step up during programming. At step 904, a first trigger condition is met. This can be based on a Vpgm level, predetermined program pulse number or a bit scan, for instance, as discussed further below. The first trigger condition represents a condition for starting a bit line step up loop for a subset of storage elements which have a common target data state. Step 906 includes performing one or more program-verify operations with a bit line step up during programming. At step 908, a second trigger condition is met. This can be based on a Vpgm level, a predetermined program pulse number or a bit scan, for instance, as discussed further below. The second trigger condition represents a condition for stopping a bit line step up loop for a subset of storage elements which have a common target data state. Step 910 includes performing one or more program-verify operations without a bit line step up during programming. In this case, the bit line may be fixed at a maximum allowed level, which is less than a lockout level. The program-verify operations end for the storage elements of the associated target data state at step 912. In practice, the storage elements which reach a verify level are locked out from further programming, so some storage elements which have a specific target data state may be locked out from programming while other storage elements which have the specific target data state continue to be programmed. In some cases, step 910 is not performed, such as when all storage elements of the associated target data state lock out in step 906. The programming technique of FIG. 9A is discussed in further detail below.

Figure 9B:
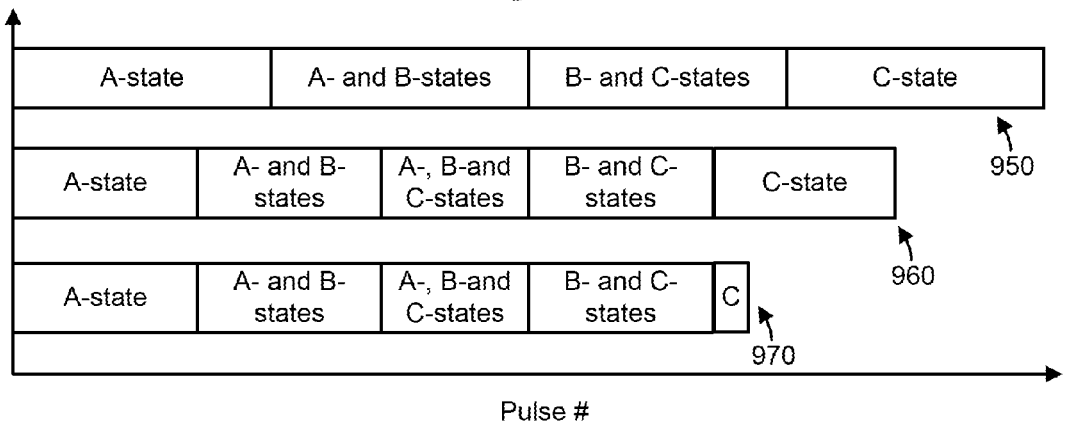
FIG. 9B depicts data states which undergo verify operations as a function of program pulse number, as an example of the programming technique of FIG. 9A.

FIG. 9B depicts data states which undergo verify operations as a function of program pulse number, as an example of the programming technique of FIG. 9A. During programming, all the storage elements are programmed together, but since the A-state verify level is lower than the B-state verify level and the B-state verify level is lower than the C-state very level, the storage elements belonging to lower target states reach their target levels sooner than for the storage elements belonging to the higher target states. Thus, to save programming time, verify operations for higher target states need not begin from the first program pulse itself. Typically, B-state verify operations can be skipped for the initial few program pulses and C-state verify operations can be skipped for further program pulses.

Sequence 950 occurs when Vbl is not stepped up as described herein, but is fixed at 0 V during programming, and $\Delta$Vpgm=$\Delta$Vpgm-effective=0.3 V, as an example. First, the A-state storage elements are verified, then the A- and B-state storage elements are verified, then the B- and C-state storage elements are verified, and finally the C-state storage elements are verified. This sequence consumes the most programming time of the three sequences 950, 960 and 970 provided. Note that in this particular example, it just so happens that there is no set of programming pulses where A-, B- and C-state storage elements are verified. With a different Vpgm step size or some changes in other device parameters, this may not be the case. That is, there may be one or more programming pulses for which A-, B- and C-state storage elements are verified, as depicted in sequences 960 and 970.

Sequence 960 occurs when Vbl is stepped up as described herein for all target data states during programming, where $\Delta$Vpgm=0.4 V and $\Delta$Vbl is chosen such that $\Delta$Vpgm-effective=0.3 V, as an example. First, the A-state storage elements are verified, then the A- and B-state storage elements are verified, then the A-, B- and C-state storage elements are verified, then the B- and C-state storage elements are verified, and finally the C-state storage elements are verified. This sequence reduces programming time compared to the sequence 950. The storage elements program faster in sequence 960 than sequence 950 because $\Delta$Vpgm=$\Delta$Vpgm-effective=0.4 V in sequence 960 both before and after the bit line step up, compared to Vpgm=$\Delta$Vpgm-effective=0.3 V throughout sequence 950. However, the same Vth distribution widths can be achieved in both sequences since $\Delta$Vpgm-effective=0.3 V during the programming of storage elements which have a common target data state in both sequences 950 and 960.

Sequence 970 occurs when Vbl is stepped up as described herein for all target data states except for the highest target data state, e.g., the C-state, during programming, where $\Delta$Vpgm=0.4 V and $\Delta$Vbl is chosen such that $\Delta$Vpgm-effective=0.3 V. First, the A-state storage elements are verified, then the A- and B-state storage elements are verified, then the A-, B- and C-state storage elements are verified, then the B- and C-state storage elements are verified, and finally the C-state storage elements are verified. This sequence reduces programming time further compared to the sequence 960 since $\Delta$Vpgm=$\Delta$Vpgm-effective=0.4 V for the C-state storage elements throughout their programming, so that the programming time of the C-state storage elements is reduced. Generally, programming time is reduced when more verify operations are performed for a given program pulse, since the number of program pulses and the associated set up time is reduced.

As mentioned, a wider Vth distribution can usually be tolerated for the highest target data state, so that programming time can be reduced further by not stepping up Vbl for the highest target data state. Specifically, the upper tail of the Vth distribution would be higher when Vbl is not stepped up. However, this is not that critical from the point of view of the Vth window, which is defined as the gap between the lowest state upper tail and the highest state lower tail. Another advantage of not stepping up Vbl for the highest target data state is that the highest Vpgm needed to program the highest-state storage elements is lower than when Vbl is stepped up. A higher Vpgm can lead to increased program disturb for the E-state storage elements. Thus, disabling the highest-state bit line step up is desirable from a program disturb point of view.

Note that this example involves a four-state memory device but the concept can be extended to additional states, such as eight or sixteen states.

FIG. 10 depicts program-verify operations as a function of program pulse number for the sequence 960 of FIG. 9B. Generally, a program operation can involve applying a pulse train to a selected word line, where the pulse train includes program pulses followed by one or more verify pulses. Each combination of a program pulse follow by one or more verify pulses forms a program-verify operation or iteration. Note that a program pulse can have any number of different waveform shapes. A square waveform is depicted, although other shapes are possible such as a multilevel shape or a ramped shape. A pulse train typically includes program pulses which increase stepwise in amplitude, typically using a fixed step size, although a varying step size can be used as well. A new pulse train can be applied in each programming pass of a multi-pass programming operation, starting at an initial Vpgm level and ending at a final Vpgm level below the maximum allowed Vpgm level. The initial Vpgm levels can be the same or different in different programming passes. The final Vpgm levels can also be the same or different in different programming passes. The step size can be the same or different in the different programming passes. In some cases, a smaller step size is used in a final programming pass to reduce Vth distribution widths.

The pulse train 1000 includes a series of program pulses 1005, 1010, 1015, 1020, 1025, 1030; 1035, 1040, 1045, 1050, 1055, 1060, 1065, 1070 and 1075 that are applied to a word line selected for programming, and an associated set of non-volatile storage elements. One, two or three verify levels are provided after each program pulse as an example, based on the target data states which are being verified. 0 V may be applied to WLn between the program and verify pulses. For example, an A-state verify pulse (e.g., waveform 1006) may be applied after each of the first, second and third program pulses 1005, 1010 and 1015, respectively. A- and B-state verify pulses (e.g., waveform 1021) may be applied after each of the fourth, fifth and sixth program pulses 1020, 1025 and 1030, respectively. A-, B- and C-state verify pulses (e.g., waveform 1036) may be applied after each of the seventh and eighth program pulses 1035 and 1040, respectively. B- and C-state verify pulses (e.g., waveform 1046) may be applied after each of the ninth, tenth and eleventh program pulses 1045, 1050 and 1055, respectively. Finally, a C-state verify pulse (e.g., waveform 1061) may be applied after each of the twelfth, thirteenth, fourteenth and fifteenth program pulses 1060, 1065, 1070 and 1075, respectively.

FIG. 11A depicts stepping up of a bit line voltage as a function of program pulse number for different data states, where a common step size is used for storage elements belonging to all data states. Waveforms 1100, 1102 and 1104 represents the bit line voltages for the A-, B- and C-states, respectively. In this example, Vbl is stepped up using a fixed step size, ΔVbl, to V1, V2, V3, V4, V5 and Vbl-max, a maximum allowed level. Vbl-lockout denotes a lockout bit line voltage, which is higher than Vbl-max. In some cases, all storage elements of a particular target state can get locked out before Vbl-max is reached Vbl-max thus is a safeguard which may or may not be reached.

For the storage elements of each target data state, the start of the bit line step up and/or the end of the bit line step up can be set based on different trigger conditions. In one approach, which is non-adaptive, a fixed Vpgm pulse number is set for the start and end of a bit line step up control loop for each target data state. For example, a ROM fuse parameter in the memory device may be set with parameters such as BL-ramp-start-A and BL-ramp-end-A as the start and end program pulse numbers for the A-state, and similarly for the other data states. In this example, BL-ramp-start-A=2, BL-ramp-end-A=7, BL-ramp-start-B=5, BL-ramp-end-B=10, BL-ramp-start-C=8 and BL-ramp-end-=13. Each data state has its own bit line step up control loop. In this example, the number of program pulses is the same in each bit line step up control loop, since the desired Vth distribution width is the same for each data state. The bit line step up control loop can be smaller, with fewer program pulses, if a wider Vth distribution width is acceptable.

Note that the Vpgm pulse numbers used for the bit line step up start and end can be chosen such that relatively few storage elements of a data state will reach the verify level and lock out before or after the bit line step up control loop of that data state, while a large majority of the storage elements will reach the verify level and lock out during the bit line step up control loop. Allowing a small number of storage elements to reach the verify level and lock out before or after the bit line step up control loop does not significantly widen the Vth distribution. However, this reduces the time in which ΔVpgm-effective is lowered, so that overall programming time is not extended unnecessarily.

Figure 11B:
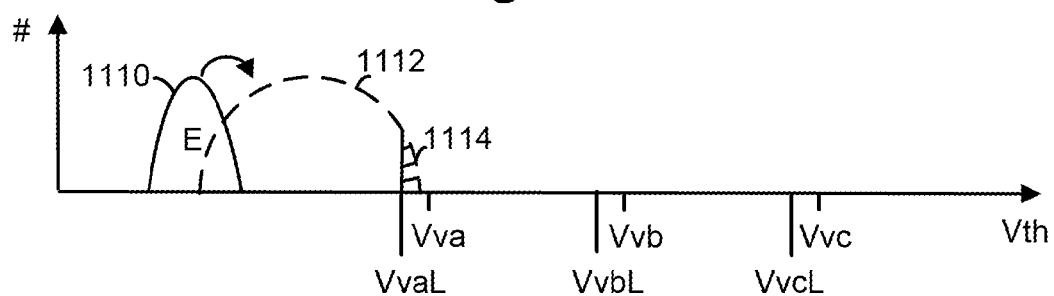
FIG. 11B depicts a trigger condition for starting a bit line step up loop for A-state storage elements.

FIG. 11B depicts a trigger condition for starting a bit line step up loop for A-state storage elements. In an example programming pass, A-state storage elements are programmed using VvaL starting from the E-state distribution 1110. After one or more program pulses, a distribution 1112 represents the A-state storage elements. A portion 1114 of the distribution 1112 represents A-state storage elements for which Vth>VvaL.

Figure 11C:
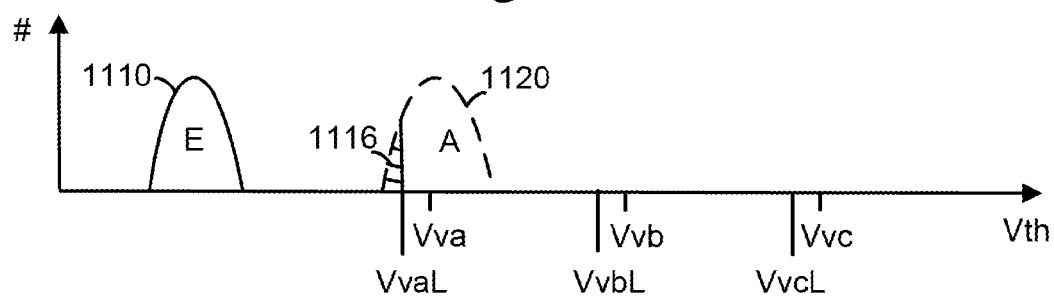
FIG. 11C depicts a trigger condition for stopping a bit line step up loop for A-state storage elements.

FIG. 11C depicts a trigger condition for stopping a bit line step up loop for A-state storage elements. After one or more additional program pulses, a distribution 1120 represents the A-state storage elements. A portion 1116 of the distribution 1120 represents A-state storage elements for which Vth<VvaL. The Vth distribution of storage elements of other target states, which may be programmed concurrently, is not depicted.

As an alternative to the non-adaptive approach mentioned above, an adaptive approach can be used to set the start and/or end of a bit line step up loop. This allows the start and/or end time to be different for different sets of storage elements in the same memory device, such as on different word lines, and in different memory devices. Moreover, the start and/or end time can differ for the same set of storage elements, such as based on changes in performance over time, as program-erase cycles are accumulated, or based on different environmental conditions such as changing temperature.

For example, instead of using fixed program pulse numbers, we can start and/or end a bit line step up loop based on a minimum number of storage elements being above or below a specified verify level. For instance, the storage elements represented by the region 1114 can be detected by a bit scan procedure in which the sense amplifier of each bit line is read to determine if the Vth>VvaL for the associated storage element. When a certain minimum number of bits, e.g., A-state storage elements, are detected above VvaL, the bit line step up loop for the A-state can start. Similarly, the bit line step up loop can stop when the number of A-state bits whose Vth is below VvaL is less than a specified number (or the number of A-state bits whose Vth>VvaL is above a specified number). The specific number of bits during bit-scan at which the bit line step up start or stop determination is made can be controlled by another ROM fuse parameter. Similar determinations can be made for other states by performing a bit-scan at their respective verify levels.

It is also possible to enforce a maximum allowed Vbl (e.g., Vbl-max in FIG. 11A) so that Vbl does not step up to an excessively high level when another trigger condition for stopping the bit line step up has not yet been met.

In another approach, the bit line step up loop can start after the bit-scan passes, and upon completion of a certain number of additional program pulses, for each data state. Similarly, the bit line step up can end after the bit-scan passes, and upon completion of a certain number of additional program pulses, for each data state.

In another approach, the bit line step up loop can start for one data state after the bit-scan passes for another, lower data state, and upon completion of a certain number of additional program pulses. For example, the bit line step up loop can start for the B-state storage elements after the bit-scan passes at VvaL for the A-state storage elements, and upon completion of a certain number of additional program pulses (such as three program pulses for consistency with FIG. 11A). A similar methodology can be used to stop the bit line step up. Using such a method, the start and stop of the bit line step up can be made adaptive for all data states by just performing bit-scan operations on the lowest state only.

Any combination of the above methods can be used as well to determine when to start and/or end a bit line step up loop for any specific target data state.

In the examples provided, an implementation of a four-state, two-bit per storage element memory device is depicted. However, the concepts can be employed with, e.g., eight- or sixteen-state devices as well. However, it may be necessary to generate additional bit line voltages concurrently.

FIG. 12A depicts a programming rate as a function of program pulse number for A-state storage elements, consistent with FIG. 11A. As mentioned, the programming speed or rate, in term of the change in Vth of a storage element per program pulse, ΔVth/pulse, is a function of Vbl. If no bit line bias is applied (Vbl=0 V), then ΔVth/pulse=R2, a higher rate. If a constant bit line step up is applied, in lockstep with the Vpgm step up, then ΔVth/pulse=R1<R2, where R1 is a lower rate. In the example of FIG. 11A, bit lines belonging to A-state storage elements start to step up at the second program pulse; thus a transition from R2 to R1 for the A-state storage elements occurs at the second program pulse. Similarly, a bit line step up for the A-state storage elements is stopped at the eighth program pulse (the last step up is at the seventh program pulse); thus, a transition from R1 back to R2 for the A-state storage elements occurs at the eighth program pulse. In practice, ΔVth/pulse may transition gradually over one or more program pulses rather than exhibit a step change which is depicted for simplicity. At the ninth program pulse, the A-state storage elements are locked out and hence the programming speed drops to zero.

FIG. 12B depicts a programming rate as a function of program pulse number for B-state storage elements, consistent with FIG. 11A. In the example of FIG. 11A, for the B-state storage elements, a transition from R2 to R1 occurs at the fifth program pulse, and later a transition from R2 to R1 occurs at the eleventh program pulse. At the twelfth program pulse, the B-state storage elements are locked out and hence the programming speed drops to zero.

FIG. 12C depicts a programming rate as a function of program pulse number for C-state storage elements, consistent with FIG. 11A. In the example of FIG. 11A, for the C-state storage elements, a transition from R2 to R1 occurs at the eighth program pulse, and later a transition from R2 to R1 occurs at the fourteenth program pulse. After the fifteenth program pulse, programming finishes and hence the program speed for the C-state storage elements drops to zero.

Figure 13:
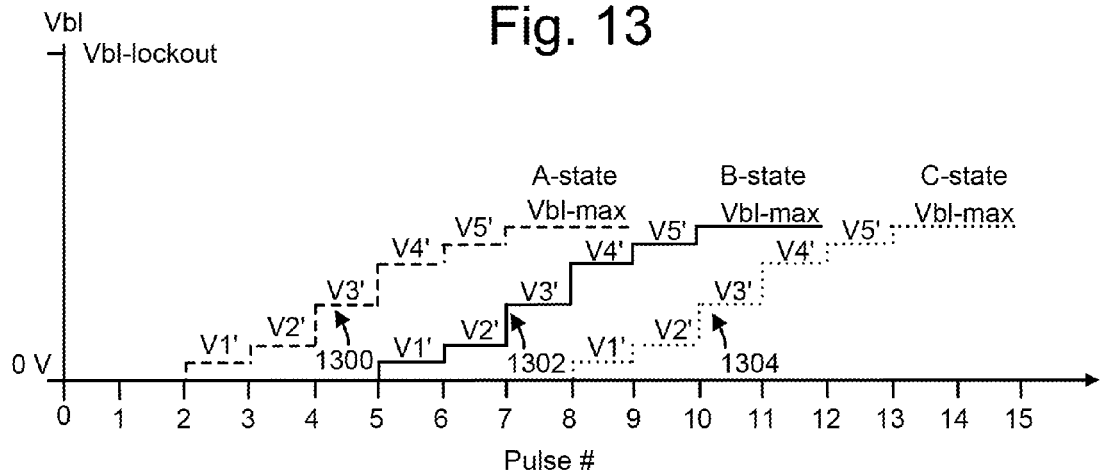
FIG. 13 depicts stepping up of a bit line voltage as a function of program pulse number for different data states, where a smaller step size, then a larger step size and then a smaller step size are used for all data states.

FIG. 13 depicts stepping up of a bit line voltage as a function of program pulse number for different data states, where a smaller step size, then a larger step size and then a smaller step size are used for all data states. In the example of FIG. 11A, Vbl stepped up using a fixed step size, i.e., at a fixed rate. In this approach, different bit line step up rates are used. It can be helpful to use a first, smaller bit line step up rate, followed by a second, larger bit line step up rate, followed by a third, smaller bit line step up rate. The third bit line step up rate is less than the second bit line step up rate, and may be equal to the first bit line step up rate. This approach slows down the programming the most when most of the storage elements are reaching the target verify level and the lockout condition, according to a Gaussian distribution. The natural programmed Vth distribution for storage elements on a given word line is generally Gaussian in nature, so that the Vth of most of the storage elements occurs near the center of the distribution while fewer cell's Vth is at the lower and upper tails of the Gaussian distribution.

Thus, for a given target data state, most of the storage elements will be locked out close to the same program pulse number, at the peak of the Gaussian distribution, so we can achieve the highest benefit-to-cost ratio by slowing down programming the most at this time with the highest bit line step up rate. The benefit is the narrowing of the Vth distribution and the cost is the increase in programming time. The storage elements which are at the lower and upper tails of the Gaussian distribution will lock out at particular program pulse numbers that are further from the program pulse at which most of the storage elements will be getting locked out. In this case, the highest benefit-to-cost ratio may be achieved by a lower, but non-zero, bit line step up rate during those particular program pulses. The storage elements which are at the far lower and far upper tails of the Gaussian distribution will lock out at other program pulse numbers that are even further from the program pulse at which most of the storage elements will be getting locked. In this case, the highest benefit-to-cost ratio may be achieved by no bit line step up during those other program pulses.

For instance, waveforms 1300, 1302 and 1304 represent the Vbl for the A-, B- and C-state storage elements, respectively. Each waveform includes the bit line levels V1', V2', V3', V4', V5' and Vbl-max. The step up rate or step size when Vbl is set to V1' and V2' is relatively small. Similarly, the step up rate or step size when Vbl is set to V5' and Vbl-max is also relatively (and optionally, equally) small. The step up rate or step size when Vbl is set to V3' and V4' is relatively large.

Figure 14:
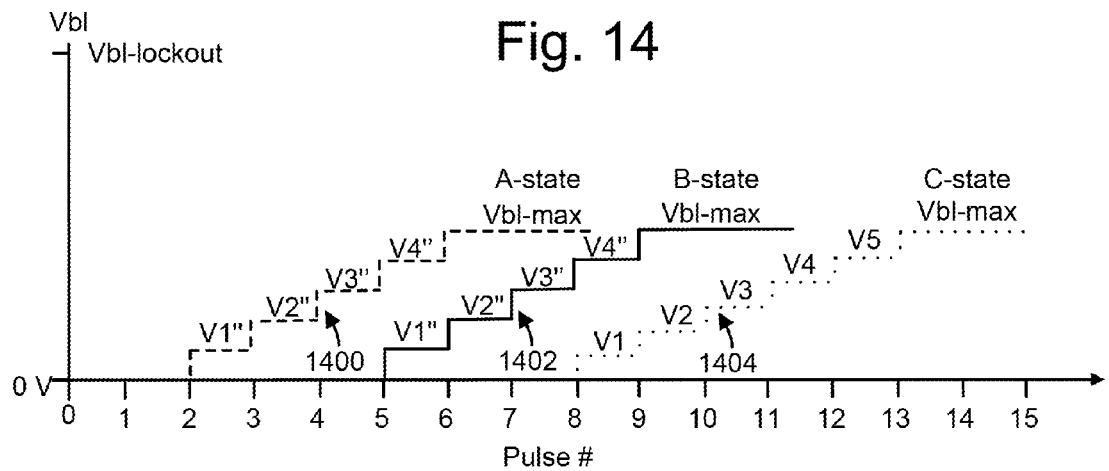
FIG. 14 depicts stepping up of a bit line voltage as a function of program pulse number for different data states, where a larger step size is used for the lower data states, and a smaller step size is used for the highest date state.

FIG. 14 depicts stepping up of a bit line voltage as a function of program pulse number for different data states, where a larger step size is used for the lower data states, and a smaller step size is used for the highest date state. This example is similar to that of FIG. 11A except a smaller Vbl step size is used for the highest state, the C-state in this example. In this case, Vbl is stepped up using a step size which is associated with the respective target data state, where different respective step sizes are associated with at least two different respective target data states of a set of possible target data states. For example, one Vbl step up rate can be used for the A- and B-state storage elements, and another, lower Vbl step up rate can be used for the C-state storage elements. The use of a smaller Vbl step up rate results in faster programming at the cost of wider Vth distribution.

Waveforms 1400, 1402 and 1404 represent Vbl for the A-, B- and C-state storage elements, respectively. Here, the Vbl levels of V1, V2, V3, V4 and V5 in waveform 1404 for the C-state may be the same as in FIG. 11A. Vbl levels of V1", V2", V3" and V4" are used in waveforms 1400 and 1402 for the A- and B-states, respectively. As mentioned, no bit line step up results in a wider Vth distribution for the highest state, and this is generally an acceptable tradeoff to reduce programming time. On the other hand a larger Vbl step up rate results in a tighter Vth distribution but longer programming time. The present example provides a compromise between using no bit line step up for the highest state, and using the larger bit line step up used for the lower states, e.g., the A-, B- and C-states. This results in a balance in that a somewhat narrower Vth distribution for the highest state is provided, compared to the case where no bit line step up is used. Programming time is longer than if no Vbl step up was used for the highest state, but shorter than if the larger Vbl step up was used for the highest state.

Figure 15:
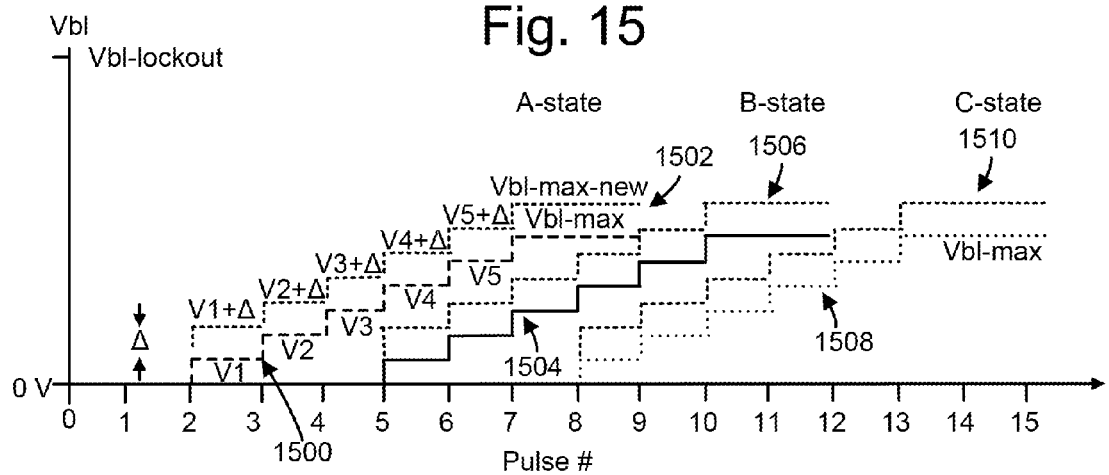
FIG. 15 depicts stepping up of a bit line voltage as a function of program pulse number for different data states, where a common step size is used for all data states, and an additional bit line voltage is added based on threshold voltage level.

FIG. 15 depicts stepping up of a bit line voltage as a function of program pulse number for different data states, where a common step size is used for all data states, and an additional bit line voltage is added based on Vth level. In some programming techniques, an additional bit line voltage (Δ) is used to slow programming, typically for all states except the highest state. This additional bit line voltage can be used for storage elements which have not yet been locked out from programming, whose Vth is between first and second verify levels of a respective target data state. For example, the first and second verify levels can be VvaL and Vva, respectively, for the A-state, VvbL and Vvb, respectively, for the B-state, and VvcL and Vvc, respectively, for the C-state, referring, e.g., to FIG. 4. In one possible implementation, the bit line step up starts at one program pulse, and the additional bit line voltage is added starting at a different program pulse. Similarly, the bit line step up can stop at one program pulse, while the additional bit line voltage stops at a different program pulse. The bit line step up can be applied concurrently to a subset of storage elements, which have a common target data state, while the additional bit line voltage is applied to an individual storage element via its bit line, regardless of the programming progress of the subset. Applying the additional bit line voltage is achieved by elevating Vbl by an additional fixed amount, beyond the current step up level. This approach could increase the number of bit line voltages which are required at a given time.

For example, for the A-state storage elements, waveforms 1500 and 1502 depict the bit line step up level without and with the additional bit line voltage added, respectively. Note that the additional bit line voltage added could also be applied before or after the bit line step up. For the B-state storage elements, waveforms 1504 and 1506 depict the bit line step up level without and with the additional bit line voltage added, respectively. For the C-state storage elements, waveforms

1508 and 1510 depict the bit line step up level without and with the additional bit line voltage added, respectively. Vbl-max-new represents a new, higher Vbl which may be permitted. Alternatively, Vbl-max may be enforced so that the bit line step up is terminated early to avoid exceeding Vbl-max. That is, the maximum allowed Vbl can be enforced on the sum of the bit line step up level and the additional bit line voltage.

In one embodiment, a method for programming a set of non-volatile storage elements includes applying a set of program pulses to the set of non-volatile storage elements, where each non-volatile storage element in the set of non-volatile storage elements is associated with a respective bit line, and the set of non-volatile storage elements includes different subsets of non-volatile storage elements. Each subset is programmed to a respective verify level (Vva, Vvb, Vvc) of a respective target data state among a plurality of target data states, including one subset of non-volatile storage elements which is programmed to one respective verify level of one respective target data state. The method further includes determining when a first trigger condition is met for the one subset of non-volatile storage elements during the set of program pulses. The method further includes, when the first trigger condition is met, stepping up a voltage of respective bit lines of non-volatile storage elements of the one subset which have not yet been locked out from programming, in lockstep with each program pulse of a plurality of successive program pulses of the set of program pulses.

In another embodiment, a corresponding non-volatile storage system includes a set of non-volatile storage elements, where the set of non-volatile storage elements includes different subsets of non-volatile storage elements, and each subset is programmed to a respective verify level of a respective target data state among a plurality of target data states, including one subset of non-volatile storage elements which is programmed to one respective verify level of one respective target data state. A respective bit line is associated with each non-volatile storage element. At least one control circuit: (a) applies a set of program pulses to the set of non-volatile storage elements, (b) determines when a first trigger condition is met for the one subset of non-volatile storage elements during the set of program pulses, and (c) when the first trigger condition is met, steps up a voltage of respective bit lines of non-volatile storage elements of the one subset which have not yet been locked out from programming, in lockstep with each program pulse of a plurality of successive program pulses of the set of program pulses.

In another embodiment, a non-volatile storage system includes means for applying a set of program pulses to a set of non-volatile storage elements, where each non-volatile storage element in the set of non-volatile storage elements is associated with a respective bit line, and the set of non-volatile storage elements includes different subsets of non-volatile storage elements. Each subset is programmed to a respective verify level (Vva, Vvb, Vvc) of a respective target data state among a plurality of target data states, including one subset of non-volatile storage elements which is programmed to one respective verify level of one respective target data state. The non-volatile storage system further includes means for determining when a first trigger condition is met for the one subset of non-volatile storage elements during the set of program pulses. The non-volatile storage system further includes means for, when the first trigger condition is met, stepping up a voltage of respective bit lines of non-volatile storage elements of the one subset which have not yet been locked out from programming, in lockstep with each program pulse of a plurality of successive program pulses of the set of program pulses.

In another embodiment, a method for programming a set of non-volatile storage elements includes applying a set of program pulses to the set of non-volatile storage elements, where each non-volatile storage element in the set of non-volatile storage elements is associated with a respective bit line, the set of non-volatile storage elements includes different subsets of non-volatile storage elements, and each subset is programmed to a respective verify level of a respective target data state among a plurality of target data states, including one subset of non-volatile storage elements which is programmed to one respective verify level of one respective target data state. The method further includes stepping up a voltage of respective bit lines of non-volatile storage elements of the one subset which have not yet been locked out from programming, in lockstep with each program pulse of a plurality of successive program pulses of the set of program pulses, determining when a trigger condition is met for the one subset of non-volatile storage elements during the set of program pulses, and when the trigger condition is met, fixing the voltage with each program pulse of one or more additional program pulses of the set of program pulses.

In another embodiment, a corresponding non-volatile storage system includes a set of non-volatile storage elements. The set of non-volatile storage elements includes different subsets of non-volatile storage elements, where each subset is programmed to a respective verify level of a respective target data state among a plurality of target data states, including one subset of non-volatile storage elements which is programmed to one respective verify level of one respective target data state. A respective bit line is associated with each non-volatile storage element. At least one control circuit: (a) applies a set of program pulses to the set of non-volatile storage elements, (b) steps up a voltage of respective bit lines of non-volatile storage elements of the one subset which have not yet been locked out from programming, in lockstep with each program pulse of a plurality of successive program pulses of the set of program pulses, (c) determines when a trigger condition is met for the one subset of non-volatile storage elements during the set of program pulses, and (d) when the trigger condition is met, fixing the voltage with each program pulse of one or more additional program pulses of the set of program pulses.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for programming a set of non-volatile storage elements, comprising:
    applying a set of program pulses to the set of non-volatile storage elements, each non-volatile storage element in the set of non-volatile storage elements is associated with a respective bit line, the set of non-volatile storage elements includes different subsets of non-volatile storage elements, each subset is programmed to a respective verify level of a respective target data state among a plurality of target data states, and the set of non-volatile storage elements includes one subset of non-volatile storage elements which is programmed to one respective verify level of one respective target data state;

determining when a first trigger condition is met for the one subset of non-volatile storage elements during the set of program pulses; and when the first trigger condition is met, stepping up a voltage of respective bit lines of non-volatile storage elements of the one subset which have not yet been locked out from programming, in lockstep with each program pulse of a plurality of successive program pulses of the set of program pulses, the voltage is stepped up to a different level for each of the successive program pulses, and each of the different levels is below a lockout level.

2. The method of claim 1, wherein:
the set of non-volatile storage elements is in communication with a common word line; and
the set of program pulses is applied to the set of non-volatile storage elements via the common word line.

3. The method of claim 1, wherein:
the first trigger condition is met based on when a predetermined program pulse number is reached.

4. The method of claim 1, wherein:
the first trigger condition is met based on when threshold voltages of at least a minimum number of the non-volatile storage elements in the one subset have been verified to reach the one respective verify level.

5. The method of claim 4, wherein:
the first trigger condition is met when the threshold voltages of the at least a minimum number of the non-volatile storage elements in the one subset have been verified to reach the one respective verify level, followed by applying a fixed number of program pulses to the set of non-volatile storage elements.

6. The method of claim 1, further comprising:
before the first trigger condition is met, fixing the voltage during each program pulse of the set of program pulses which precedes the first trigger condition.

7. The method of claim 1, further comprising:
elevating the voltage by an additional fixed amount, for non-volatile storage elements of the one subset which have not yet been locked out from programming, whose threshold voltage is between first and second verify levels of the one respective target data state.

8. The method of claim 1, wherein:
the voltage is stepped up using a step size which is associated with the one respective target data state, where different respective step sizes are associated with at least two different respective target data states of the plurality of target data states.

9. The method of claim 1, wherein:
the voltage is stepped up at a first rate and then at a second rate, higher than the first rate, during the plurality of successive program pulses.

10. The method of claim 9, wherein:
the voltage is subsequently stepped up at a third rate which is less than the second rate, during the plurality of successive program pulses.

11. The method of claim 1, further comprising:
determining when a second trigger condition is met for the one subset of non-volatile storage elements during the set of program pulses; and
when the second trigger condition is met, fixing the voltage below the lockout level, during each program pulse of one or more additional program pulses of the set of program pulses.

12. The method of claim 1, wherein the different subsets of non-volatile storage elements include another subset of non-volatile storage elements which is programmed to another respective verify level of another respective target data state, which is higher than the one respective target data state, the method further comprising:

determining when another trigger condition is met for the another subset of non-volatile storage elements during the set of program pulses; and when the another trigger condition is met, stepping up a voltage of respective bit lines of non-volatile storage elements of the another subset which have not yet been locked out from programming, in lockstep with each program pulse of another plurality of successive program pulses of the set of program pulses, where the another trigger condition is met after the first trigger condition is met.

13. The method of claim 12, wherein:
the another trigger condition is met based on when the first trigger condition is met, followed by applying a fixed number of program pulses to the set of non-volatile storage elements.

14. A method for programming a set of non-volatile storage elements, comprising:
applying a set of program pulses to the set of non-volatile storage elements, each non-volatile storage element in the set of non-volatile storage elements is associated with a respective bit line, the set of non-volatile storage elements includes different subsets of non-volatile storage elements, each subset is programmed to a respective verify level of a respective target data state among a plurality of target data states, and the set of non-volatile storage elements includes one subset of non-volatile storage elements which is programmed to one respective verify level of one respective target data state;

stepping up a voltage of respective bit lines of non-volatile storage elements of the one subset which have not yet been locked out from programming, in lockstep with each program pulse of a plurality of successive program pulses of the set of program pulses, the voltage is stepped up to a different level for each of the successive program pulses, and each of the different levels is below a lockout level;

determining when a trigger condition is met for the one subset of non-volatile storage elements during the set of program pulses; and when the trigger condition is met, fixing the voltage below the lockout level with each program pulse of one or more additional program pulses of the set of program pulses.

15. The method of claim 14, wherein:
the trigger condition is met based on how many non-volatile storage elements in the one subset have a threshold voltage below the one respective verify level.

16. The method of claim 14, wherein:
the trigger condition is met when the voltage reaches a maximum allowed level, which is below the lockout level.

17. The method of claim 14, wherein:
the trigger condition is met when a specified number of program pulses of the successive program pulses of the set of program pulses have been applied to the set of non-volatile storage elements.

18. A non-volatile storage system, comprising:
a set of non-volatile storage elements, the set of non-volatile storage elements includes different subsets of non-volatile storage elements, each subset is programmed to a respective verify level of a respective target data state among a plurality of target data states, and the set of non-volatile storage elements includes one subset of non-volatile storage elements which is programmed to one respective verify level of one respective target data state;

a respective bit line associated with each non-volatile storage element; and at least one control circuit, the at least one control circuit: applies a set of program pulses to the set of non-volatile storage elements, determines when a first trigger condition is met for the one subset of non-volatile storage elements during the set of program pulses, and when the first trigger condition is met, steps up a voltage of respective bit lines of non-volatile storage elements of the one subset which have not yet been locked out from programming, in lockstep with each program pulse of a plurality of successive program pulses of the set of program pulses, the voltage is stepped up to a different level for each of the successive program pulses, and each of the different levels is below a lockout level.

19. The non-volatile storage system of claim 18, wherein:
the first trigger condition is met based on when threshold voltages of at least a minimum number of the non-volatile storage elements in the one subset have been verified to reach the one respective verify level.

20. The non-volatile storage system of claim 18, wherein:
the voltage is stepped up until the voltage reaches a maximum allowed level which is below the lockout level.

21. The non-volatile storage system of claim 18, wherein:
the voltage is stepped up at a first rate and then at a second, higher rate during the plurality of successive program pulses.

22. The non-volatile storage system of claim 21, wherein:
the voltage is stepped up to at least three different levels.

23. A non-volatile storage system, comprising:
a set of non-volatile storage elements, the set of non-volatile storage elements includes different subsets of non-volatile storage elements, each subset is programmed to a respective verify level of a respective target data state among a plurality of target data states, and the set of non-volatile storage elements includes one subset of non-volatile storage elements which is programmed to one respective verify level of one respective target data state;

a respective bit line associated with each non-volatile storage element; and at least one control circuit, the at least one control circuit: applies a set of program pulses to the set of non-volatile storage elements, steps up a voltage of respective bit lines of non-volatile storage elements of the one subset which have not yet been locked out from programming, in lockstep with each program pulse of a plurality of successive program pulses of the set of program pulses, the voltage is stepped up to a different level for each of the successive program pulses, and each of the different levels is below a lockout level, determines when a trigger condition is met for the one subset of non-volatile storage elements during the set of program pulses, and when the trigger condition is met, fixing the voltage below the lockout level with each program pulse of one or more additional program pulses of the set of program pulses.

24. The non-volatile storage system of claim 23, wherein:
the trigger condition is met based on how many non-volatile storage elements in the one subset have a threshold voltage below the one respective verify level.

25. The non-volatile storage system of claim 23, wherein:
the trigger condition is met when the voltage reaches a maximum allowed level, which is below the lockout level.

26. The non-volatile storage system of claim 23, wherein:
the trigger condition is met when a specified number of program pulses of the successive program pulses of the set of program pulses have been applied to the set of non-volatile storage elements.

* * * * *